(12) United States Patent
Nishiyama

(10) Patent No.: US 7,248,445 B2
(45) Date of Patent: Jul. 24, 2007

(54) CPP MAGNETIC SENSING ELEMENT AND METHOD FOR MAKING THE SAME

(75) Inventor: Yoshihiro Nishiyama, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 912 days.

(21) Appl. No.: 10/241,989

(22) Filed: Sep. 11, 2002

(65) Prior Publication Data

US 2003/0053269 A1 Mar. 20, 2003

(30) Foreign Application Priority Data

Sep. 14, 2001 (JP) .............................. 2001-279194

(51) Int. Cl.
*G11B 5/33* (2006.01)
*G11B 5/127* (2006.01)

(52) U.S. Cl. .............................. 360/324.1; 360/324.11; 360/324.12; 29/603.08; 428/811; 428/811.5

(58) Field of Classification Search ............. 360/324.1, 360/324.11, 324.12; 428/811, 811.5
See application file for complete search history.

(56) References Cited

U.S. PATENT DOCUMENTS

| 5,446,613 | A | | 8/1995 | Rottmayer |
| 5,474,833 | A | | 12/1995 | Etienne et al. |
| 5,668,688 | A | | 9/1997 | Dykes et al. |
| 5,739,990 | A | * | 4/1998 | Ravipati et al. ........ 360/324.12 |
| 5,751,526 | A | * | 5/1998 | Schemmel ................. 360/317 |
| 5,936,810 | A | * | 8/1999 | Nakamoto et al. ........ 360/324.1 |
| 6,222,707 | B1 | * | 4/2001 | Huai et al. ................ 360/324.1 |
| 6,292,336 | B1 | * | 9/2001 | Horng et al. ........... 360/324.12 |
| 6,535,363 | B1 | * | 3/2003 | Hosomi et al. .......... 360/324.1 |
| 6,545,847 | B2 | * | 4/2003 | Nakamoto et al. ....... 360/324.1 |
| 6,717,778 | B2 | * | 4/2004 | Arasawa et al. ....... 360/324.12 |

(Continued)

FOREIGN PATENT DOCUMENTS

JP 2001-052316 2/2001

(Continued)

OTHER PUBLICATIONS

Copy of Notification of Refusal dated Sep. 21, 2004 for corresponding Japanese Patent Application No. 2001-279194.

(Continued)

*Primary Examiner*—Tan Dinh
*Assistant Examiner*—Christopher R. Magee
(74) *Attorney, Agent, or Firm*—Brinks Hofer Gilson & Lione

(57) ABSTRACT

A magnetic sensing element includes a composite film, a lower shield layer, and a lower electrode layer and an upper electrode layer for supplying a current perpendicular to the composite film. The composite film has an antiferromagnetic layer, a pinned magnetic layer, a nonmagnetic layer, and a free magnetic layer. The composite film has a top face and two side faces in a track width direction. Each of the two side faces has a bent position. The angle defined by the side face below the bent position and the top face is larger than the angle defined by the side face above the bent position and the top face. The bent portion preferably lies on the lower electrode layer or the lower shield layer.

24 Claims, 21 Drawing Sheets

U.S. PATENT DOCUMENTS 6,770,382 B1 * 8/2004 Chang et al. ............. 428/811.3
6,927,952 B2 * 8/2005 Shimizu et al. ......... 360/324.12
6,950,290 B2 * 9/2005 Hayashi et al. .......... 360/324.1

FOREIGN PATENT DOCUMENTS

| JP | 2002-05011 | 2/2002 |
| JP | 2002-299726 | 10/2002 |
| JP | 2002-324928 | 11/2002 |

OTHER PUBLICATIONS

Copy of Notification of Refusal dated Sep. 13, 2005 for corresponding Japanese Patent Application No. 2001-279194.

* cited by examiner

CPP MAGNETIC SENSING ELEMENT AND METHOD FOR MAKING THE SAME

BACKGROUND OF THE INVENTION

1. Field of the Invention

The present invention relates to CPP (current perpendicular to plane) magnetic sensing elements. In particular, the present invention relates to a CPP magnetic sensing element that does not cause short-circuiting between thin layers constituting the magnetic sensing element and a method for making the same.

2. Description of the Related Art

FIGS. 16 to 19 are partial cross-sectional view of a known magnetic sensing element and a method for making the same. These drawings are cross-sectional views when viewed from a face opposing a recording medium (hereinafter referred to as merely "opposing face"). Referring to FIG. 16, a lower shield layer 1, a lower electrode layer 2, an underlayer 3, a seed layer 4, an antiferromagnetic layer 5, a pinned magnetic layer 6, a nonmagnetic layer 7, a free magnetic layer 8, and a protective layer 9 are continuously formed on a substrate (not shown) in that order by sputtering. The pinned magnetic layer 6 includes a first pinned magnetic sublayer 6a, a nonmagnetic interlayer 6b, and a second pinned magnetic sublayer 6c. The free magnetic layer 8 includes a first free magnetic sublayer 8a, a nonmagnetic interlayer 8b, and a second free magnetic sublayer 8c. Layers from the underlayer 3 to the protective layer 9 constitute a composite film T.

The lower shield 1 is composed of NiFe, and the lower electrode layer 2 is composed of Cu. The underlayer 3 is composed of Ta, and the seed layer 4 is composed of NiFe. The antiferromagnetic layer 5 is composed of PtMn. The first pinned magnetic sublayer 6a, the second pinned magnetic sublayer 6c, the first free magnetic sublayer 8a, and the second free magnetic sublayer 8c are composed of CoFe. The nonmagnetic interlayers 6b and 8b are composed of Ru. The nonmagnetic layer 7 is composed of Cu, and the protective layer 9 is composed of Ta.

A resist layer R1 is formed on the composite film T. The width of the resist layer R1 in the track width direction (X direction in the drawing) is substantially the same as the track width of the magnetic sensing element.

Referring to FIG. 17, both uncovered portions of the composite film T are removed by ion milling at angle θ from the normal line such that the composite film T has a trapezoidal cross-sectional shape. The angle θ of ion milling is about 5°.

Referring to FIG. 18, on each side of the composite film T, an insulating layer 10 of alumina, a CoPt hard bias layer 11, and an insulating layer 12 of alumina are formed by sputtering. The resist layer R1 is removed, and a Cu upper electrode layer 13 and a NiFe upper shield layer 14 are formed on the composite. A magnetic sensing element shown in FIG. 19 is thereby obtained.

The magnetic sensing element shown in FIG. 19 is of spin-valve type. In the spin-valve type, the magnetization of the pinned magnetic layer is adequately pinned in a direction parallel to the Y direction in the drawing while the magnetization of the free magnetic layer is adequately oriented in the X direction, the pinned magnetic layer and the free magnetic layer having an orthogonal magnetization relationship. In response to a leakage magnetic field from a recording medium, the magnetization direction of the free magnetic layer sensitively changes. Such a change of the magnetization direction causes a change in electrical resistance of the magnetic sensing element. As a result, the leakage magnetic field from the recording medium can be detected as a change in voltage due to a change in electrical resistance.

The magnetic sensing element shown in FIG. 19 is of a CPP type in which a sensing current flows perpendicularly to the composite film T, for example, from the upper electrode layer 13 to the lower electrode layer 2.

In the known magnetic sensing element shown in FIG. 19, the upper face of each insulating layer 12 is curved downward near the corresponding side face Ts of the composite film T in the track width direction to form a dent A on the side face Ts. This is because the materials for the insulating layer 10, the hard bias layer 11, and the insulating layer 12 are not sufficiently deposited near the side faces Ts of the composite film T by the hindrance of the resist layer R1, in the step shown in FIG. 18. Furthermore, the alumina insulating layer 12 is etched by an alkaline material used in patterning of the upper electrode layer 13, and the dents A at the side faces Ts become larger.

The dents A cause short-circuiting between the side faces Ts of the composite film T and the Cu upper electrode layers 13 that formed in the dents A. The short-circuiting decreases sensitivity of the magnetic sensing element. In particular, in a bottom spin-valve magnetic sensing element shown in FIG. 19 of which the free magnetic layer 8 is formed above the antiferromagnetic layer 5, short-circuiting causing a decrease in output easily occurs between the sides of the free magnetic layer 8 and the upper electrode layer 13.

If the dents A reach positions B depicted by dot lines in FIG. 19, the upper electrode layer 13 comes into contact with all sides of the free magnetic layer 8, nonmagnetic layer 7, and pinned magnetic layer 6. In such a case, the free magnetic layer 8 and the pinned magnetic layer 6 are short-circuited and the magnetic sensing element is not sensitive to an external magnetic field.

If thick insulating layers 12 are formed to prevent short-circuiting between the side faces Ts of the composite film T and the upper electrode layer 13 as shown in FIG. 20, layers S corresponding to the insulating layers 10, the hard bias layers 11, and the insulating layers 12 formed on the sides and top of the resist layer R1 connect to the insulating layers 12. After the resist layer R1 is removed, the layers S remain as fins C on the insulating layers 12 as shown in FIG. 21. An upper electrode layer 13 formed on the insulating layers 12 with fins C cannot have a reproducible shape; hence, the connection resistance between the composite film T and the upper electrode layer 13 varies.

SUMMARY OF THE INVENTION

An object of the present invention is to provide a magnetic sensing element having high magnetic sensitivity and a method for making the same. In the present invention, an upper electrode layer can be precisely formed and the upper electrode layer comes into contact with only the top face of the composite film.

According to a first aspect of the present invention, a magnetic sensing element includes a composite film and a lower electrode layer and an upper electrode layer for supplying a current perpendicular to the composite film. The composite film includes an antiferromagnetic layer, a pinned magnetic layer, a nonmagnetic layer, and a free magnetic layer. The composite film has a top face and two side faces in a track width direction, and each of the two side faces has a bent position. The angle defined by the side face below the bent position and the top face is larger than the angle defined by the side face above the bent position and the top face.

The tilt of the side faces of the composite film is gentler at a position below the bent position than above the bent position. The side faces below the bent position function as raising layers when insulating layers and other layers are formed on the side faces. The raising layers prevent the formation of dents between the side faces of the composite film and layers such as the insulating layers formed on the side faces. Thus, short-circuiting does not occur between the upper electrode layer and the composite film at the side faces. Since a variation in electrically connecting area between the composite film and the upper electrode layer can be suppressed at a predetermined level or less, the magnetic sensing element has sensitivity with reduced variation. Furthermore, the thickness of the insulating layers can be reduced such that no fin is formed on the insulating layers.

Since the bent positions are located below the free magnetic layer, the track width direction of the magnetic sensing element defined by the free magnetic layer does not so significantly increase.

According to a second aspect of the present invention, a magnetic sensing element include a composite film, a lower shield layer, and a lower electrode layer and an upper electrode layer for supplying a current perpendicular to the composite film. The composite film includes an antiferromagnetic layer, a pinned magnetic layer, a nonmagnetic layer, and a free magnetic layer. The composite film has a top face and two side faces in a track width direction, and each of the side faces has a bent portion on one of the lower electrode layer and the lower shield layer. The angle defined by the side face below the bent portion and the top face of the composite film is larger than that defined by the side face above the bent portion and the top face.

The tilt of the side faces of the composite film is gentler at a position below the bent position than above the bent position. The side faces below the bent position function as raising layers when insulating layers and other layers are formed on the side faces. The raising layers prevent the formation of dents between the side faces of the composite film and layers such as the insulating layers formed on the side faces. Thus, short-circuiting does not occur between the upper electrode layer and the composite film at the side faces. Since a variation in electrically connecting area between the composite film and the upper electrode layer can be suppressed at a predetermined level or less, the magnetic sensing element has a sensitivity with reduced variation. Furthermore, the thickness of the insulating layers can be reduced such that no fin is formed on the insulating layers.

In the present invention, the upper electrode layer is formed over the composite film and layers that are formed on the side faces of the composite film and are flush with the composite film.

Preferably, the magnetic sensing element further includes upper insulating layers for electrically insulating the upper electrode layer from the side faces of the composite film. The upper insulating layers have flat surfaces. The uppermost insulating layers at both the sides of the composite film at T1 have flat surfaces that are flush with the top face of the composite film. Thus, the upper electrode layer formed on the flush surfaces also has a precisely flat surface.

Preferably, the magnetic sensing element further includes lower insulating layers on the side faces of the composite film, for electrically insulating the lower electrode layer from the side faces of the composite film.

In the magnetic sensing element according to the present invention, the antiferromagnetic layer, the pinned magnetic layer, the nonmagnetic layer, and the free magnetic layer are disposed in that order from the bottom.

In general, a bottom-type spin-valve magnetic sensing element in which a free magnetic layer lies above an antiferromagnetic layer often causes short-circuiting between the side faces of the free magnetic layer and the upper electrode layer. Thus, the above configuration effectively preventing short-circuiting is advantageous to the bottom-type spin-valve magnetic sensing element.

In the bottom spin-valve magnetic sensing element, the bent position may lie at the corresponding side face in the track width direction of the pinned magnetic layer or the antiferromagnetic layer.

Alternatively, the free magnetic layer, the nonmagnetic layer, the pinned magnetic layer, and the antiferromagnetic layer may be disposed in that order from the bottom. This magnetic sensing element is called a top spin-valve magnetic sensing element.

The magnetic sensing element may further include hard bias layers composed of a hard magnetic material, the hard bias layers opposing side faces in the track width direction of at least the free magnetic layer and aligning the magnetization of the free magnetic layer in the track width direction.

Alternatively, the magnetic sensing element may further include exchange bias layers composed of an antiferromagnetic material and overlapping with the free magnetic layer, the exchange bias layers aligning the magnetization of the free magnetic layer in the track width direction.

Alternatively, the magnetic sensing element may further include a spacing layer in contact with one face, opposite to the nonmagnetic layer, of the free magnetic layer and a ferromagnetic in-stack bias layer in contact with the spacing layer, the in-stack bias layer aligning the magnetization of the free magnetic layer in the track width direction.

Preferably, the magnetic sensing element further includes specular layers on the side faces of the composite film in the track width direction.

In the present invention, the track width defined by the width of the free magnetic layer is preferably in the range of 10 nm to 100 nm, and more preferably in the range of 10 to 60 nm. With a decrease in the track width, the read output is improved.

According to another aspect of the present invention, a method for making a magnetic sensing element includes the steps of:

(a) forming a lower shield layer and a lower electrode layer on a substrate, and forming a composite film including an antiferromagnetic layer, a pinned magnetic layer, a nonmagnetic layer, and a free magnetic layer on the lower electrode layer;

(b) forming a resist layer on a part of the composite film, and milling uncovered regions in a track width direction of the composite film at a first incident angle to the normal line of the composite film to remove the composite film up to a predetermined position below the free magnetic layer;

(c) milling the remaining layers of the composite film at a second incident angle larger than the first incident angle to remove the composite film below the predetermined position;

(d) removing the resist layer: and (e) forming an upper electrode layer on the top face of the composite film, the upper electrode layer electrically connecting with the composite film.

The incident angle in ion milling is varied in the steps (b) and (c) so that the angle between the top face and side faces below the predetermined portion of the composite film is larger that the angle between the top face and the side faces above the predetermined portion.

The side faces below the predetermined position function as raising layers when insulating layers and other layers are formed on the side faces. The raising layers prevent the formation of dents between the side faces of the composite film and layers such as the insulating layers formed on the side faces. Thus, short-circuiting does not occur between the upper electrode layer and the composite film at the side faces. Since a variation in electrically connecting area between the composite film and the upper electrode layer can be suppressed at a predetermined level or less, the magnetic sensing element has sensitivity with reduced variation. Furthermore, the thickness of the insulating layers can be reduced such that no fin is formed on the insulating layers.

Preferably, in the step (b), the first incidental angle is in the range of 5° to 20° whereas, in the step (c), the second incident angle is in the range of 45° to 60°.

Preferably, the method further includes a step of forming insulating layers for electrically insulating the side faces of the composite film from the upper electrode layer between the step (c) and the step (d). Preferably, the upper faces of the insulating layers are flat.

Preferably, the method further includes a step of forming insulating layers for electrically insulating the side faces in the track width direction of the composite film from the lower electrode layer between the step (c) and the step (d).

In the step (a), the antiferromagnetic layer, the pinned magnetic layer, the nonmagnetic layer, and the free magnetic layer may be formed in that order from the bottom. Alternatively, the free magnetic layer, the nonmagnetic layer, the pinned magnetic layer, and the antiferromagnetic layer may be formed in that order from the bottom.

The method may further include a step (h) of forming hard bias layers composed of a hard magnetic material on the side faces in the track width direction of at least the free magnetic layer between the step (c) and the step (d).

The method may further include a step (i) of forming exchange bias layers composed of an antiferromagnetic material and overlapping with the free magnetic layer between the step (c) and the step (d).

In the step (a), a ferromagnetic in-stack bias layer with a spacing layer may be formed on one face, opposite to the nonmagnetic layer, of the free magnetic layer, the spacing layer being disposed between the ferromagnetic in-stack bias layer and the free magnetic layer.

Preferably, the method further includes a step (j) of forming specular layers on the side faces of the composite film in the track width direction between the step (c) and the step (d).

DESCRIPTION OF THE PREFERRED EMBODIMENTS

Figure 1:
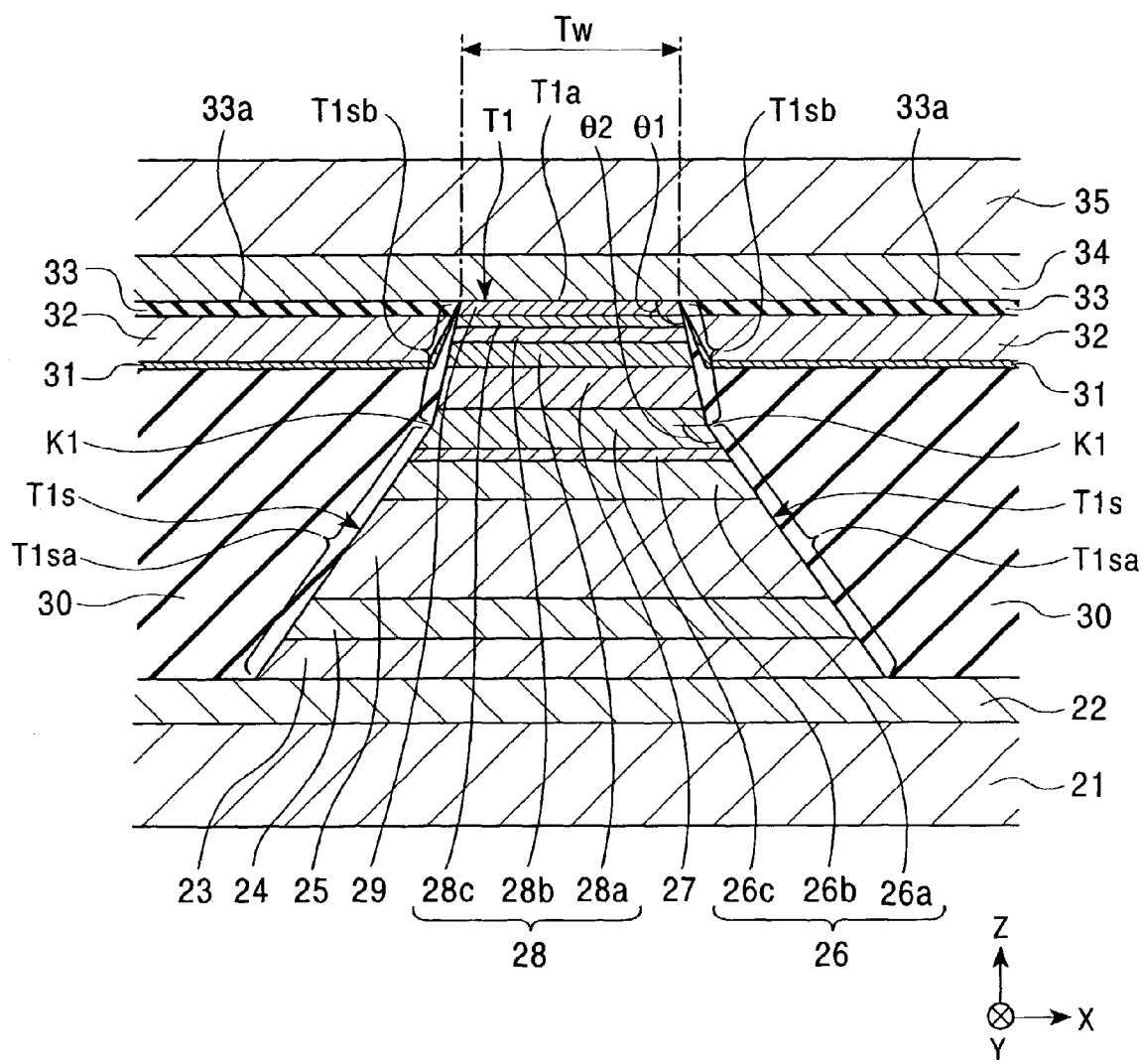
FIG. 1 is a cross-sectional view of a magnetic sensing element according to a first embodiment of the present invention.

FIG. 1 is a partial cross-sectional view, viewed from a face opposing a recording medium (hereinafter referred to as "opposing face") of a magnetic sensing element according to a first embodiment of the present invention. This magnetic sensing element is included in an MR head for reading external signals recorded on a recording medium. The opposing face is perpendicular to a face of any thin film of the magnetic sensing element and is parallel to the magnetization direction of the free magnetic layer of magnetic sensing element when no external magnetic field is applied. In FIG. 1, the opposing face is parallel to the X-Z plane. When the magnetic sensing element is included in a floating magnetic head, the opposing face is called an air bearing surface (ABS).

For example, the magnetic sensing element is formed on a trailing side face of a slider composed of alumina-titanium carbide ($Al_2O_3$—TiC). At the leading side face, the slider connects with an elastically deformable supporting member composed of, for example, stainless steel. A magnetic head device has such a configuration.

The track width direction represents a width direction of a region in which the magnetization direction varies in response to an external magnetic field. For example, the track width direction is the magnetization direction of the free magnetic layer when no external magnetic field is applied, namely, the X direction in the drawing. The width of the free magnetic layer in the track width direction defines the track width Tw of the magnetic sensing element. The recording medium faces the opposing face of the magnetic sensing element and moves in the Z direction in the drawing. The leakage magnetic field from the recording medium is oriented in the Y direction in the drawing.

In FIG. 1, a lower electrode layer 22 is formed on a lower shield layer 21. An underlayer 23, a seed layer 24, an antiferromagnetic layer 25, a synthetic ferri-pinned type pinned magnetic layer 26 (including a first pinned magnetic sublayer 26a, a nonmagnetic interlayer 26b, and a second pinned magnetic sublayer 26c), a nonmagnetic layer 27, a synthetic ferri-pinned type free magnetic layer 28 (including a second free magnetic sublayer 28a, a nonmagnetic interlayer 28b, and a first free magnetic sublayer 28c), and a protective layer 29 are formed on the lower electrode layer 22 in that order. Layers from the underlayer 23 to the protective layer 29 constitute a composite film T.

An upper electrode layer 34 and an upper shield layer 35 are formed on the composite film T1. Insulating layers 30 are formed on two side faces T1s of the composite film T1 and on the lower electrode layer 22 for electrically insulating the side faces T1s and the lower electrode layer 22 in the track width direction.

Bias underlayers 31 and hard bias layers 32 are formed on the insulating layers 30 such that these layers faces the free magnetic layer 28 in the X direction. The insulating layers 30 insulate the upper electrode layer 34 from the side faces T1s of the composite film T1, the hard bias layers 32, and the bias underlayers 31.

In this embodiment, the insulating layers 30 insulate the entire side faces T1s of the composite film T1; however, the insulating layers 30 are thin between the free magnetic layer 28 and the hard bias layers 32 so that a sufficient magnitude of bias magnetic field is applied to the free magnetic layer 28.

The magnetic sensing element shown in FIG. 1 is of a bottom spin-valve type. The magnetization of the pinned magnetic layer 26 is pinned in a direction parallel to the Y direction in the drawing by an exchange anisotropic magnetic field between the antiferromagnetic layer 25 and the pinned magnetic layer 26, whereas the magnetization of the free magnetic layer 28 is oriented in the X direction in the drawing by a static magnetic field from the hard bias layers 32. Accordingly, the magnetization of the pinned magnetic layer 26 is perpendicular to the magnetization of the free magnetic layer 28.

When a leakage magnetic field from a recording medium penetrates the magnetic sensing element in the Y direction in the drawing, the magnetization of the free magnetic layer 28 varies sensitively. Such a change in the magnetization of the free magnetic layer 28 causes a change in electrical resistance of the magnetic sensing element. As a result, the leakage magnetic field from the recording medium can be detected as a change in voltage due to the change in electrical resistance.

Specifically, the relative angle between the magnetization direction of the second pinned magnetic sublayer 26c and the magnetization direction of the second free magnetic sublayer 28a directly causes a change in electrical resistance (output). Preferably, the relative angle is perpendicular when no static magnetic field is applied and when a driving circuit flows through.

In the magnetic sensing element of the present invention, a sensing current flows in a direction perpendicular to the layers constituting the composite film T1, for example, from the upper electrode layer 34 to the lower electrode layer 22. A magnetic sensing element allowing such a flow of the sensing current is called a CPP magnetic sensing element.

The lower shield layer 21, the lower electrode layer 22, the underlayer 23, the seed layer 24, the antiferromagnetic layer 25, the pinned magnetic layer 26, the nonmagnetic layer 27, the free magnetic layer 28, the protective layer 29, the insulating layers 30, the bias underlayers 31, the hard bias layers 32, the insulating layers 33, the upper electrode layer 34, and the upper shield layer 35 are formed by a thin-film forming process such as a sputtering process and a vacuum deposition process.

The lower shield layer 21 and the upper shield layer 35 are composed of a magnetic material such as NiFe.

Preferably, the easy axes of the lower shield layer 21 and the upper shield layer 35 are oriented in the track width direction (X direction in the drawing). The lower shield layer 21 and the upper shield layer 35 may be formed by an electrolytic plating process.

The underlayer 23 is preferably composed of at least one element selected from the group consisting of Ta, Hf, Nb, Zr, Ti, Mo, and W. The underlayer 23 generally has a thickness of 50 Å or less. The underlayer 23 may be omitted in the present invention.

The seed layer 24 is composed of NiFe, NiFeCr, or Cr. In the CPP magnetic sensing element, a sensing current must also flow in the seed layer 24. Thus, the seed layer 24 is preferably composed of a low-resistivity material. More specifically, the seed layer 24 of the CCP magnetic sensing element is preferably composed of a NiFe alloy or elemental Cr. The seed layer 24 may be omitted in the present invention.

The antiferromagnetic layer 25 is composed of a PtMn alloy, an X—Mn alloy, or an Pt—Mn—X' alloy, wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr. These alloys have a disordered face-centered cubic structure after the formation of the layer, but have an ordered CuAuI-type face-centered tetragonal structure by transformation during annealing. The antiferromagnetic layer 25 has a thickness in the range of 80 to 300 Å and typically a thickness of 200 Å in the center in the track width direction.

In the PtMn alloy and the X—Mn alloy, the Pt content and the X content are preferably in the range of 37 to 63 atomic percent and more preferably in the range of 47 to 57 atomic percent. In the Pt—Mn—X' alloy, the X'+Pt content is preferably in the range of 37 to 63 atomic percent and more preferably 47 to 57 atomic percent. The X' content is preferably in the range of 0.2 to 10 atomic percent. When the X' is at least one element selected from Pd, Ir, Rh, Ru, Os, Ni, and Fe, the X' content is preferably in the range of 0.2 to 40 atomic percent.

The antiferromagnetic layer 25 composed of the above alloy exhibits a large exchange coupling magnetic field by annealing. In particular, the antiferromagnetic layer 25 composed of a PtMn alloy exhibits an exchange coupling magnetic field of at least 48 kA/m, for example, 64 kA/m or more. Furthermore, this alloy has a high blocking temperature of 380° C. The blocking temperature represents a temperature at which the exchange coupling magnetic field disappears. Accordingly, the antiferromagnetic layer 25 exhibits high thermal stability.

The first pinned magnetic sublayer 26a and the second pinned magnetic sublayer 26c are composed of a ferromagnetic material such as a NiFe alloy, elemental Co, a CoFeNi alloy, a CoFe alloy, or a CoNi alloy. These layers are preferably composed of a CoFe alloy or elemental Co. Preferably, these layers are composed of the same material. The nonmagnetic interlayer 26b is composed of a nonmagnetic material. Preferably, the nonmagnetic interlayer 26b is composed of at least one metal selected from the group consisting of Ru, Rh, Ir, Cr, Re, and Cu. More preferably, this layer is composed of Ru. The first pinned magnetic sublayer 26a and the second pinned magnetic sublayer 26c have a thickness in the range of about 10 to 70 Å. The nonmagnetic interlayer 26b has a thickness in the range of about 3 to 10 Å.

The pinned magnetic layer 26 may have a single-layer configuration composed of the above magnetic material or may have a double-layer configuration including a magnetic layer and a antidiffusion layer composed of Co or the like.

The nonmagnetic layer 27 prevents magnetic coupling between the pinned magnetic layer 26 and the free magnetic layer 28. Thus, the nonmagnetic layer 27 is preferably composed of a nonmagnetic conductive material, i.e., Cu, Cr, Au, or Ag. More preferably, the nonmagnetic layer 27 is composed of Cu. The nonmagnetic layer 27 generally has a thickness in the range of about 18 to 30 Å.

The nonmagnetic layer 27 may be composed of an insulating material, i.e., $Al_2O_3$ or $SiO_2$; however, a sensing current must also flow perpendicularly in the nonmagnetic layer 27 in the CPP semiconductor element. Thus, the thickness of the nonmagnetic layer 27 composed of the insulating material must be as low as 50 Å in order to reduce resistance. The nonmagnetic layer 27 may be composed of a material having a specular effect, i.e., $Al_2O_3$ or $TaO_2$. In such a case, the nonmagnetic layer 27 also functions as a specular layer or a current confining layer that reduces the effective element area.

The first free magnetic sublayer 28c and the second free magnetic sublayer 28a are composed of a ferromagnetic material. Examples of the ferromagnetic materials are NiFe alloys, elemental Co, CoFeNi alloys, CoFe alloys, and CoNi alloys. Preferably, these layers are composed of one of the NiFe alloys, elemental Co, the CoFe alloys, and CoFeNi alloys.

Preferably, in this embodiment, at least one of the first free magnetic sublayer 28c and the second free magnetic sublayer 28a is composed of a magnetic material having a composition CoFeNi wherein the Fe content is in the range of 9 to 17 atomic percent and the Ni content is in the range of 0.5 to 10 atomic percent. This composition enhances an exchange coupling magnetic field by the RKKY interaction that is generated between the first free magnetic sublayer 28c and the second free magnetic sublayer 28a. More specifically, the spin-flop magnetic field (Hsf) can be enhanced to about 293 kA/m, wherein the spin-flop magnetic field represents a magnetic field when the antiparallel state disappears. As a result, the first free magnetic sublayer 28c and the second free magnetic sublayer 28a have an antiparallel magnetization arrangement.

Preferably, both the first free magnetic sublayer 28c and the second free magnetic sublayer 28a are composed of the CoFeNi alloy to generate a high and stable spin-flop magnetic field. The antiparallel magnetization arrangement between these free magnetic sublayers is further stabilized.

The first free magnetic sublayer 28c and the second free magnetic sublayer 28a having the above composition have a low magnetostriction in the range of $-3 \times 10^{-6}$ to $3 \times 10^{-6}$ and a low coercive force of 790 A/m or less. Furthermore, the free magnetic layer 28 exhibits improved soft magnetic characteristics. In addition, diffusion of Ni from the free magnetic layer 28 to the nonmagnetic layer 27 is reduced; hence, the magnetic sensing element exhibits a large change in resistance ($\Delta R$) and a large ratio of change in resistance ($\Delta R/R$) that are essential for high sensitivity.

When the second free magnetic sublayer 28a and the nonmagnetic layer 27 are separated by an antidiffusion layer composed of Co or the like, and when at least one of the second free magnetic sublayer 28a and the first free magnetic sublayer 28c is composed of the CoFeNi alloy, preferably, the Fe content is in the range of 7 to 15 atomic percent and the Ni content is in the range of 5 to 15 atomic percent.

The nonmagnetic interlayer 28b is composed of at least one nonmagnetic material selected from the group consisting of Ru, Rh, Ir, Cr, Re, and Cu. Among these, Ru is preferred.

The first free magnetic sublayer 28c and the second free magnetic sublayer 28a have a thickness in the range of about 10 to 70 Å. The nonmagnetic interlayer 28b has a thickness in the range of about 3 to 10 Å.

Preferably, the second free magnetic sublayer 28a has a double-layer configuration including a Co layer that faces the nonmagnetic layer 27. The Co layer prevents diffusion of metallic atoms from the second free magnetic sublayer 28a to the nonmagnetic layer 27; hence, the magnetic sensing element exhibits a large ratio of change in resistance ($\Delta R/R$). The free magnetic layer 28 may have a single-layer configuration composed of the above magnetic material.

The protective layer 29 is composed of at least one element selected from the group consisting of Ta, Hf, Nb, Zr, Ti, Mo, and W. The protective layer 29 has a thickness of about 30 Å.

In FIG. 1, the first pinned magnetic sublayer 26a and the second pinned magnetic sublayer 26c have different magnetic thicknesses (Msxt: product of saturation magnetization and thickness). The composite of the first pinned magnetic sublayer 26a and the second pinned magnetic sublayer 26c separated by the nonmagnetic interlayer 26b functions as a pinned magnetic layer 26.

The first pinned magnetic sublayer 26a is in contact with the antiferromagnetic layer 25. An exchange anisotropic magnetic field is generated by exchange coupling at the interface between the first pinned magnetic sublayer 26a and the antiferromagnetic layer 25 during annealing in a predetermined magnetic field. As a result, the magnetization of the first pinned magnetic sublayer 26a is pinned in the Y direction in the drawing; the magnetization of the second pinned magnetic sublayer 26c is pinned in a direction antiparallel to the magnetization direction of the first pinned magnetic sublayer 26a. In such a ferrimagnetic arrangement (antiparallel arrangement), the first pinned magnetic sublayer 26a and the second pinned magnetic sublayer 26c mutually pin the magnetization directions of the others. On the whole, the magnetization of the pinned magnetic layer 26 is tightly pinned in a predetermined direction.

The magnetization direction of the pinned magnetic layer 26 is defined by a synthetic magnetic thickness (Msxt) that is a sum of the magnetic thickness of the first pinned magnetic sublayer 26a and the magnetic thickness of the second pinned magnetic sublayer 26c. In FIG. 1, the first pinned magnetic sublayer 26a and the second pinned magnetic sublayer 26c are composed of the same material but have different thicknesses so that the magnetic thicknesses thereof are different.

The magnetostatic coupling of the first pinned magnetic sublayer 26a and the second pinned magnetic sublayer 26c offsets the demagnetizing field (dipole magnetic field) due to pinned magnetization of the first pinned magnetic sublayer 26a and the second pinned magnetic sublayer 26c. Thus, the free magnetic layer 28 is less affected by the demagnetizing field (dipole magnetic field) of the pinned magnetic layer 26. Thus, the direction of the variable magnetization of the free magnetic layer 28 can be easily oriented in a desired direction. The resulting spin-valve thin-film magnetic element exhibits high symmetry or low asymmetry of the output waveform. When asymmetry is zero, the output waveform is completely symmetry.

When the magnetization direction of the free magnetic layer 28 is perpendicular to the magnetization direction of the pinned magnetic layer 26, the asymmetry is zero. At a large asymmetry, signals cannot be exactly read from a recording medium. Thus, a spin-valve thin-film magnetic element having small asymmetry is highly reliable in signal processing.

The demagnetizing field (dipole magnetic field) Hd by pinned magnetization of the pinned magnetic layer 26 has an uneven distribution in the height direction of the free magnetic layer 28, namely, is large at both ends and is small in the center. This uneven distribution may inhibit single-domain alignment in the free magnetic layer 28. In the present invention, the pinned magnetic layer 26 has a multilayer configuration to reduce the dipole magnetic field Hd. As a result, magnetic unevenness due to magnetic walls in the free magnetic layer 28 is prevented. Thus, the magnetic sensing element does not generate Barkhausen noise.

The free magnetic layer 28 is composed of the second free magnetic sublayer 28a and first free magnetic sublayer 28c having different magnetic thicknesses (Msxt: product of saturation magnetization and thickness) separated by the nonmagnetic interlayer 28b. The magnetization of the second free magnetic sublayer 28a and the magnetization of the first free magnetic sublayer 28c are antiparallel, in other words, in a ferrimagnetic state. The magnetization of a layer having a larger magnetic thickness, for example, the second free magnetic sublayer 28a is oriented in a direction of a magnetic field generated from the hard bias layers (X direction in the drawing) while the magnetization of the first free magnetic sublayer 28c is oriented in the opposite direction (antiparallel to the X direction in the drawing).

The antiparallel or ferrimagnetic magnetization state of the second free magnetic sublayer 28a and the first free magnetic sublayer 28c has the same advantage as that of a smaller thickness of the free magnetic layer 28. Since the effective magnetic moment per unit area is small in this state, the magnetization of the free magnetic layer 28 can sensitively varies. Accordingly, the magnetic sensing element has high sensitivity to a magnetic field. The magnetization direction of the free magnetic layer 28 is defined by a synthetic magnetic thickness (Msxt) that is a sum of the magnetic thickness of the second free magnetic sublayer 28a and the first free magnetic sublayer 28c. Only the magnetization direction of the second free magnetic sublayer 28a contributes to output, in connection with the magnetization of the pinned magnetic layer 26. When no external magnetic field is applied, the magnetization of the free magnetic layer 28 is parallel to the opposing face.

The hard bias layers 32 may orient the magnetization direction of one of the second free magnetic sublayer 28a and the first free magnetic sublayer 28c. For example, the magnetization of the second free magnetic sublayer 28a is oriented in a predetermined direction, whereas the magnetization of the first free magnetic sublayer 28c is antiparallel to that of the second free magnetic sublayer 28a (ferrimagnetic state). As a result, the magnetization of the entire free magnetic layer 28 is oriented in a predetermined direction.

The hard bias layers 32 are composed of a CoPt (cobalt-platinum) alloy or a CoCrPt (cobalt-chromium-platinum) alloy. The composition of such an alloy is generally determined so that the bulk crystal thereof includes a mixed phase of a face-centered cubic (fcc) structure and a close-packed hexagonal (hcp) structure.

Preferably, the bias underlayers 31 are composed of at least one metal selected from the group consisting of Cr, Ti, W, Mo, V, Mn, Nb, and Ta. For example, the layers are composed of elemental Cr or a $W_{50}Mo_{50}$ alloy. Bias underlayers 31 composed of Cr having a body-centered cubic (bcc) crystal structure increase the coercive force and remanence ratio of the hard bias layers 32, resulting in an enhanced bias magnetic field.

Since, the bcc lattice constants of the bias underlayers 31 are nearly equal to the hcp lattice constants of the CoPt alloy of the hard bias layers 32, the CoPt preferentially has a hcp structure rather than the fcc structure. The c axis of the hcp lattice is predominantly oriented in the interfacial plane between the CoPt alloy and the bias underlayer 31. Since the hcp structure has large magnetic anisotropy in the c axis compared with the fcc structure, the coercive force Hc when a magnetic field is applied to the hard bias layers is large. Furthermore, the preferential c-axis orientation in the interfacial plane causes an increase in remanent magnetization and thus an increase in remanence ratio S (remanent magnetization/saturation magnetization). As a result, the hard bias layers 32 can generate a larger bias magnetic field.

When the upper electrode layer 34 is composed of Ta, a Cr interlayer is preferably provided under the upper electrode layer 34 so that the Ta layer on the Cr layer has a bcc crystal structure having low electrical resistance. When the upper electrode layer 34 is composed of Cr, a Ta interlayer is preferably provided under the upper electrode layer 34 so that low-resistance Cr epitaxially grows.

The lower electrode layer 22 and the upper electrode layer 34 may be composed of W, Ta, Cr, Cu, Rh, Ir, Ru, or Au. The insulating layers 30 and the insulating layers 33 are composed of alumina ($Al_2O_3$) and silicon oxide ($SiO_2$). The thickness of the insulating layer 33 is preferably in the range of about 50 to 200 Å to sufficiently insulate the upper electrode layer 34 from the side faces Ts1 of the composite film T and to prevent shunt from the upper electrode layer 34 to the hard bias layers 32 of the sensing current.

In the magnetic sensing element shown in FIG. 1, the angle defined by each side face T1s of the composite film T1 in the track width direction and the top face T1a of the composite film T1 (protective layer 29) is larger at a lower portion than at an upper portion of a bent position K1 which lies below the free magnetic layer 28. Specifically, the angle θ2 defined by the side face T1sa below the bent position K1 and the top face T1a of the composite film T1 is larger than the angle θ1 defined by the side face T1sb above the bent position K1 and the top face T1a of the composite film T1. In FIG. 1, the bent position K1 lies on each side face of the second pinned magnetic sublayer 26c.

In such a configuration, the side faces T1sa below the bent position K1 function as raising layers when the insulating layers 30, the bias underlayers 31, the hard bias layers 32, and the insulating layers 33 are formed on the lower electrode layer 22 at both sides of the composite film T1. The raising layers prevent the formation of dents between the side faces T1s of the composite film T1 and the insulating layers 33. Thus, short-circuiting does not occur between the upper electrode layer 34 and the composite film T1 at the side faces T1s. Since a variation in electrically connecting area between the composite film T1 and the upper electrode layer 34 can be suppressed at a predetermined level or less, the magnetic sensing element has a sensitivity with reduced variation. Furthermore, the thickness of the insulating layers 33 can be reduced such that no fin is formed on the insulating layers 33.

The thickness in the track width direction of the layers (nonmagnetic interlayer 26b, first pinned magnetic sublayer 26a, antiferromagnetic layer 25, seed layer 24, and underlayer 23) of the composite film T1 below the bent position K1 is significantly larger than that of the layers (nonmagnetic layer 27, free magnetic layer 28, and protective layer 29) above the bent position K1. Since the bent position K1 is located below the free magnetic layer 28, the track width direction of the magnetic sensing element defined by the free magnetic layer 28 does not so significantly increase.

In FIG. 1, the uppermost insulating layers 33 at both the sides of the composite film T1 have flat surfaces 33a that are flush with the top face T1a of the composite film T1. Thus, the upper electrode layer 34 formed on the flush surfaces also has a precisely flat surface.

In the magnetic sensing element shown in FIG. 1, when the insulating layers 30, the bias underlayers 31, the hard bias layers 32, and the insulating layers 33 are formed by sputtering, the surfaces 33a of the insulating layers 33 become automatically flush with the top face T1a of the composite film T1, as will be described in a production process below. Since the configuration shown in FIG. 1 requires no planarizing process (for example, CMP), the surface of the composite film T1 is smooth and securely connects with the upper electrode layer 34.

In general, a bottom-type spin-valve magnetic sensing element in which a free magnetic layer lies above an antiferromagnetic layer often causes short-circuiting between the side faces of the free magnetic layer and the upper electrode layer. Thus, the configuration shown in FIG. 1, which effectively prevents short-circuiting, is advantageous to the bottom-type spin-valve magnetic sensing element.

In the present invention, the track width Tw defined by the width of the free magnetic layer 28 is preferably in the range of 10 nm to 100 nm, and more preferably in the range of 10 to 60 nm. With a decrease in the track width Tw, the read output is improved.

Figure 2:
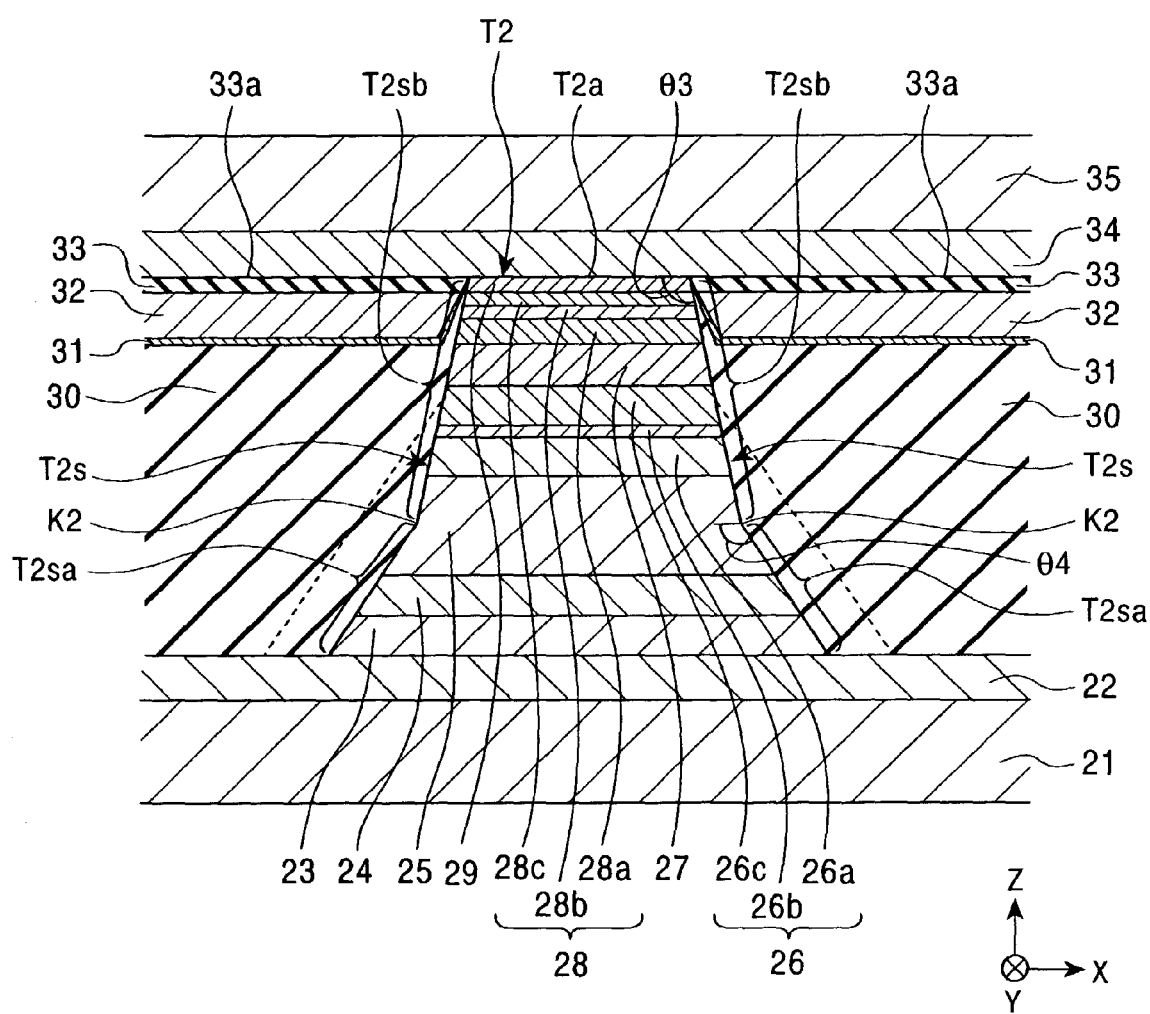
FIG. 2 is a cross-sectional view of a magnetic sensing element according to a second embodiment of the present invention.

FIG. 2 is a partial cross-sectional view, viewed from an opposing face, of a magnetic sensing element according to a second embodiment of the present invention. The magnetic sensing element in this embodiment is different from that in the first embodiment shown in FIG. 1 in that a bent position K2 lies at side faces of the antiferromagnetic layer 25 in the track width direction.

In the magnetic sensing element shown in FIG. 2, the angle defined by each side face T2s of a composite film T2 in the track width direction and the top face T2a of the composite film T2 (protective layer 29) is also larger at a lower portion than at an upper portion of a bent position K2. Specifically, the angle $\theta 4$ defined by the side face T2sa below the bent position K2 and the top face T2a of the composite film T2 is larger than the angle $\theta 3$ defined by the side face T2sb above the bent position K2 and the top face T2a of the composite film T2.

In this magnetic sensing element, the top faces 33a of the insulating layers 33 are also flush with the top face T2a of the composite film T2. Thus, the upper electrode layer 34 formed on the flush surfaces also has a precisely flat surface. Since a variation in electrically connecting area between the composite film T2 and the upper electrode layer 34 can be suppressed at a predetermined level or less, the magnetic sensing element has a sensitivity with reduced variation. Furthermore, the thickness of the insulating layers 33, which electrically insulates the side face T2s of the composite film T2 from the lead layers 34, can be reduced such that no fin is formed on the insulating layers 33.

In the magnetic sensing element shown in FIG. 2, in the track width direction, the width of the pinned magnetic layer 26 is also reduced as the width of the free magnetic layer 28 is reduced. In such a configuration, the magnetic track width of the spin-valve magnetic sensing element can be more effectively reduced. The bent position K2 may be determined at any layer below the free magnetic layer 28. For example, the bent position K2 may be located at the side face of the nonmagnetic layer 27.

Figure 3:
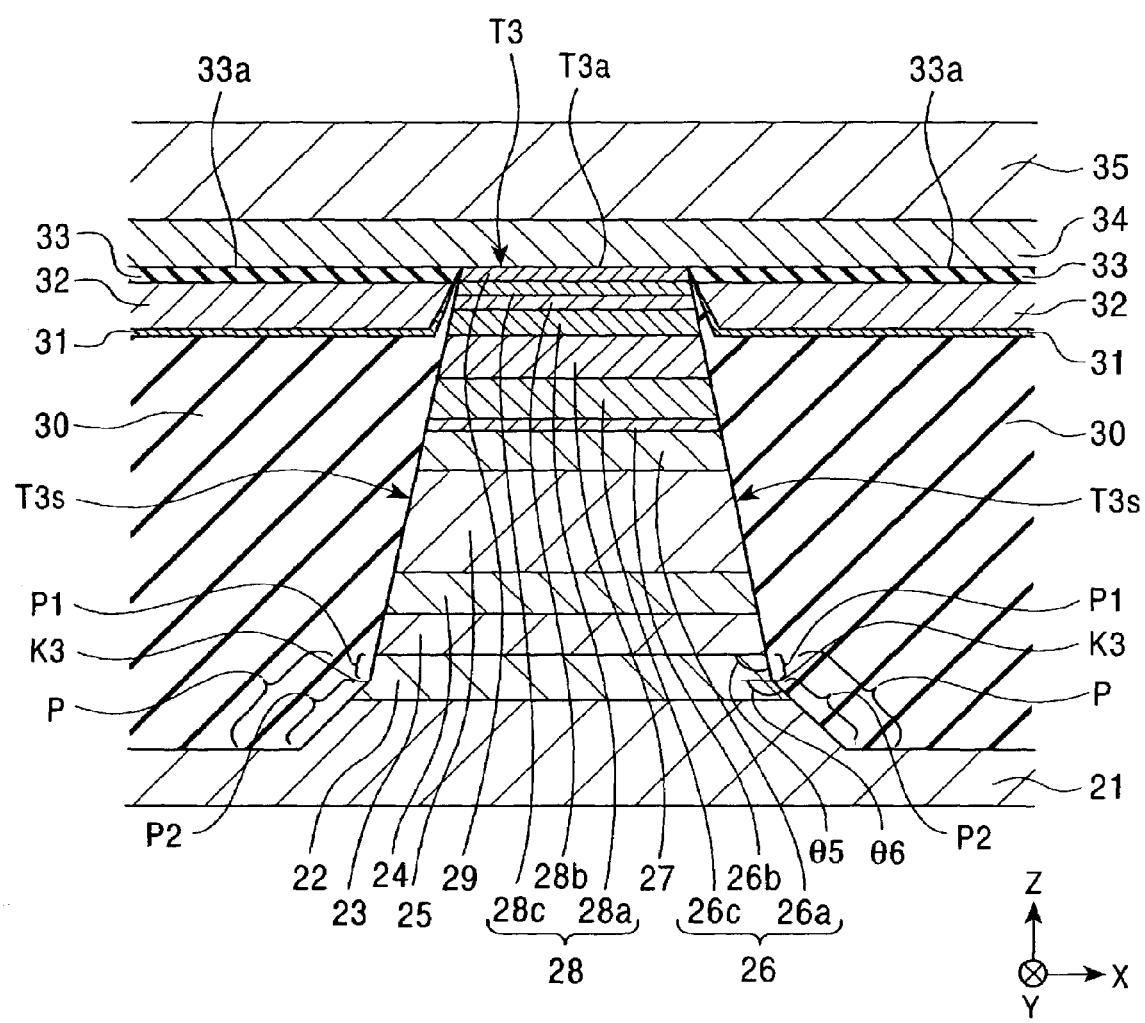
FIG. 3 is a cross-sectional view of a magnetic sensing element according to a third embodiment of the present invention.

FIG. 3 is a partial cross-sectional view, viewed from an opposing face, of a magnetic sensing element according to a third embodiment of the present invention. In the magnetic sensing element of this embodiment, the lower electrode layer 22 and the lower shield layer 21 have side portions P including side faces P1 that are flush with side faces T3s of the composite film T3. A bent position K3 lies at the side faces of the lower electrode layer 22. The angle $\theta 6$ defined by the side face P2 below the bent position K3 and the top face T3a of the composite film T3 is larger than the angle $\theta 5$ defined by the side face P1 above the bent position K3 and the top face T3a of the composite film T3.

In such a configuration, the side faces P2 below the bent position K3 function as raising layers when the insulating layers 30, the bias underlayers 31, the hard bias layers 32, and the insulating layers 33 are formed on the lower shield layer 21 at both sides of the composite film T3. The raising layers prevent the formation of dents between the side faces T3s of the composite film T3 and the insulating layers 33.

In this magnetic sensing element, the top faces 33a of the insulating layers 33 are also flush with the top face T3a of the composite film T3. Thus, the upper electrode layer 34 formed on the flush surfaces also has a precisely flat surface. Since a variation in electrically connecting area between the composite film T3 and the upper electrode layer 34 can be suppressed at a predetermined level or less, the magnetic sensing element has a sensitivity with reduced variation. Furthermore, the thickness of the insulating layers 33, which electrically insulate the side face T3s of the composite film T3 from the-lead layers 34, can be reduced such that no fin is formed on the insulating layers 33.

As shown in FIG. 3, the width of the upper face of the lower electrode layer 22 in the track width direction is almost the same as that of the bottommost underlayer 23 of the composite film T3. Thus, a reduced current flows to both side regions of the composite film T3.

Figure 4:
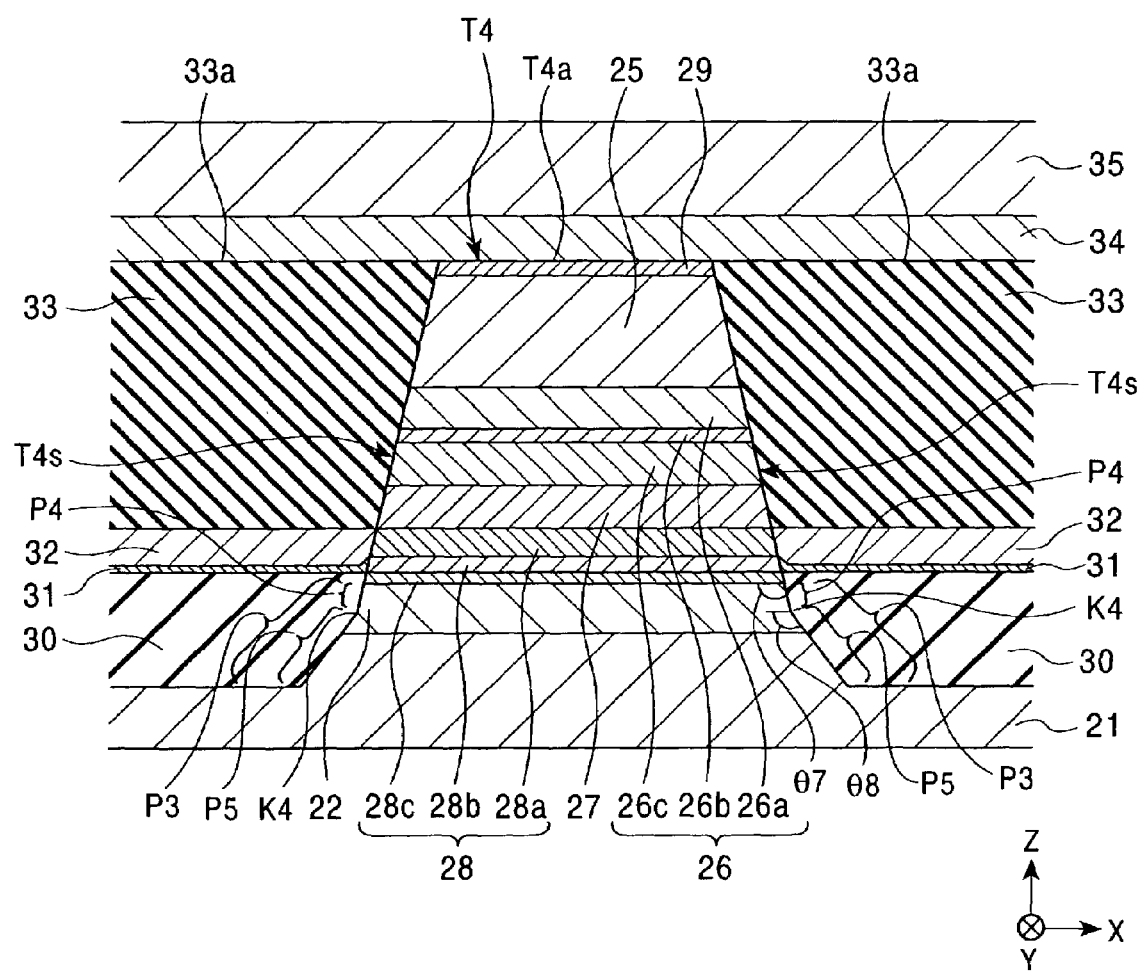
FIG. 4 is a cross-sectional view of a magnetic sensing element according to a fourth embodiment of the present invention.

FIG. 4 is a partial cross-sectional view, viewed from an opposing face, of a magnetic sensing element according to a fourth embodiment of the present invention. The magnetic sensing element of this embodiment is of a top spin-valve type, in which a free magnetic layer 28, a nonmagnetic layer 27, a pinned magnetic layer 26, and an antiferromagnetic layer 25 are formed in that order from the bottom.

In the magnetic sensing element of this embodiment, the lower electrode layer 22 and the lower shield layer 21 have side portions P3 including side faces P4 that are flush with side faces T4s of the composite film T4. A bent position K4 lies at the side faces of the lower electrode layer 22. The angle θ8 defined by the side face P5 below the bent position K4 and the top face T4a of the composite film T4 is larger than the angle θ7 defined by the side face P4 above the bent position K4 and the top face T4a of the composite film T4.

In such a configuration, the side faces P5 below the bent position K4 function as raising layers when the insulating layers 30, the bias underlayers 31, the hard bias layers 32, and the insulating layers 33 are formed on the lower shield layer 21 at both sides of the composite film T4. The raising layers prevent the formation of dents between the side faces T4s of the composite film T4 and the insulating layers 33.

In this magnetic sensing element, the top faces 33a of the insulating layers 33 are also flush with the top face T4a of the composite film T4. Thus, the upper electrode layer 34 formed on the flush surfaces also has a precisely flat surface. Since a variation in electrically connecting area between the composite film T4 and the upper electrode layer 34 can be suppressed at a predetermined level or less, the magnetic sensing element has a sensitivity with reduced variation. Furthermore, the thickness of the insulating layers 33, which electrically insulate the side face T4s of the composite film T4 from the lead layers 34, can be reduced such that no fin is formed on the insulating layers 33.

In FIG. 4, the hard bias layers 32 orient the magnetization of only the second free magnetic sublayer 28a. As a result, the magnetization of the first free magnetic sublayer 28c is oriented antiparallel to the magnetization direction of the second free magnetic sublayer 28a (ferrimagnetic state), and the overall magnetization of the free magnetic layer 28 is oriented in a predetermined direction.

In the magnetic sensing elements shown in FIGS. 1 to 4, the hard bias layers 32 faces the side faces of the free magnetic layer 28 to orient the magnetization of the free magnetic layer 28 in the track width direction.

In the magnetic sensing elements shown in FIGS. 1 to 4, the side faces below the bent position function as raising layers that prevent the formation of downward curvatures at the top faces of the hard bias layers 32 near the side faces of the composite film. The flat hard bias layers 32 can supply a bias magnetic field parallel to the layer plane to the free magnetic layer 28.

Figure 5:
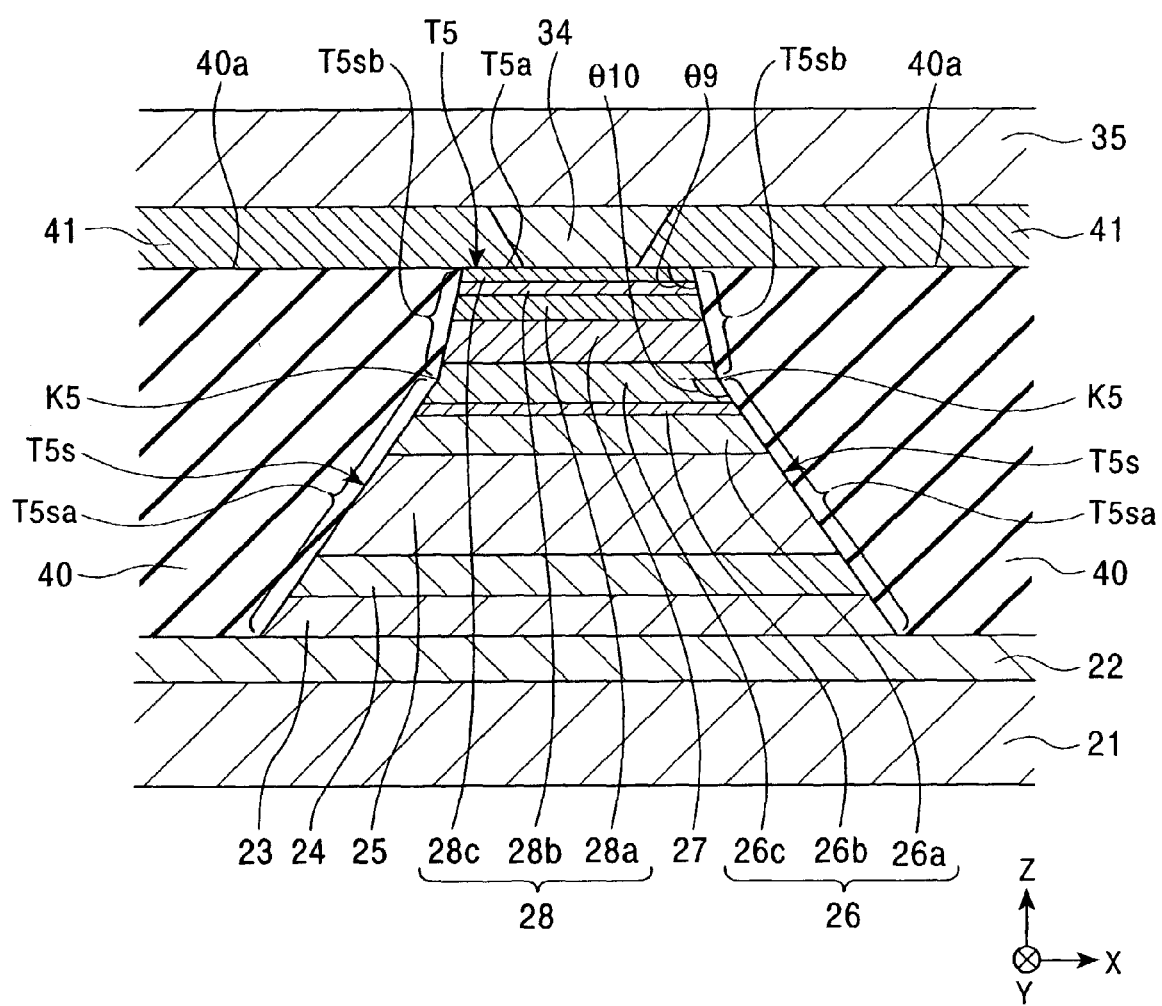
FIG. 5 is a cross-sectional view of a magnetic sensing element according to a fifth embodiment of the present invention.

A magnetic sensing element shown in FIG. 5 is different from those shown in FIGS. 1 to 4 in that electrode layers 22 are covered with insulating layers 40 composed of alumina or silicon oxide, at both sides of a composite film T5, and exchange bias layers 41 are formed over the insulating layers 40 and parts of the top face T5a of the composite film T5 so that the exchange bias layers 41 are in contact with a free magnetic layer 28. An upper electrode layer 34 is formed between these two exchange bias layers 41.

The exchange bias layers 41 may be composed of the same material as that for the antiferromagnetic layer 25, namely, a PtMn alloy, an X—Mn alloy, or an Pt—Mn—X' alloy, wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

The magnetization of the first free magnetic sublayer 28c is oriented in the track width direction (X direction in the drawing) by an exchange anisotropic magnetic field by the exchange bias layers 41, while the magnetization of the second free magnetic sublayer 28a in oriented in a direction antiparallel to the X direction in the drawing by the RKKY interaction with the first free magnetic sublayer 28c. In other words, the free magnetic layer 28 is aligned into a single magnetic domain state by the exchange bias layers 41. As a result, an optical track width defined by the distance between the exchange bias layers 41 is the same as the magnetic track width defined by the width of a magnetically variable region in the track width direction of the free magnetic layer 28. An advantage of this configuration is that the region defined by the optical track width has no insensitive region. In contrast, a configuration for applying a bias magnetic field from hard bias layers inevitably forms insensitive regions.

Also in the magnetic sensing element shown in FIG. 5, the angle θ10 defined between the top face T5a and the side faces T5sa below the bent position K5 of the composite film T5 is larger than the angle θ9 defined between the top face T5a and the side faces T5sb above the bent position K5. Thus, the upper faces 40a of the insulating layers 40 can be formed so as to be flush with the top face T5a of the composite film T5. Also, the exchange bias layer 41 formed on the flat surface has a precisely flat surface; a stable exchange anisotropic magnetic field can be generated between the exchange bias layers 41 and the first free magnetic sublayer 28c. A ferromagnetic or nonmagnetic metal layer may be formed between the exchange bias layers 41 and the free magnetic layer 28.

Figure 6:
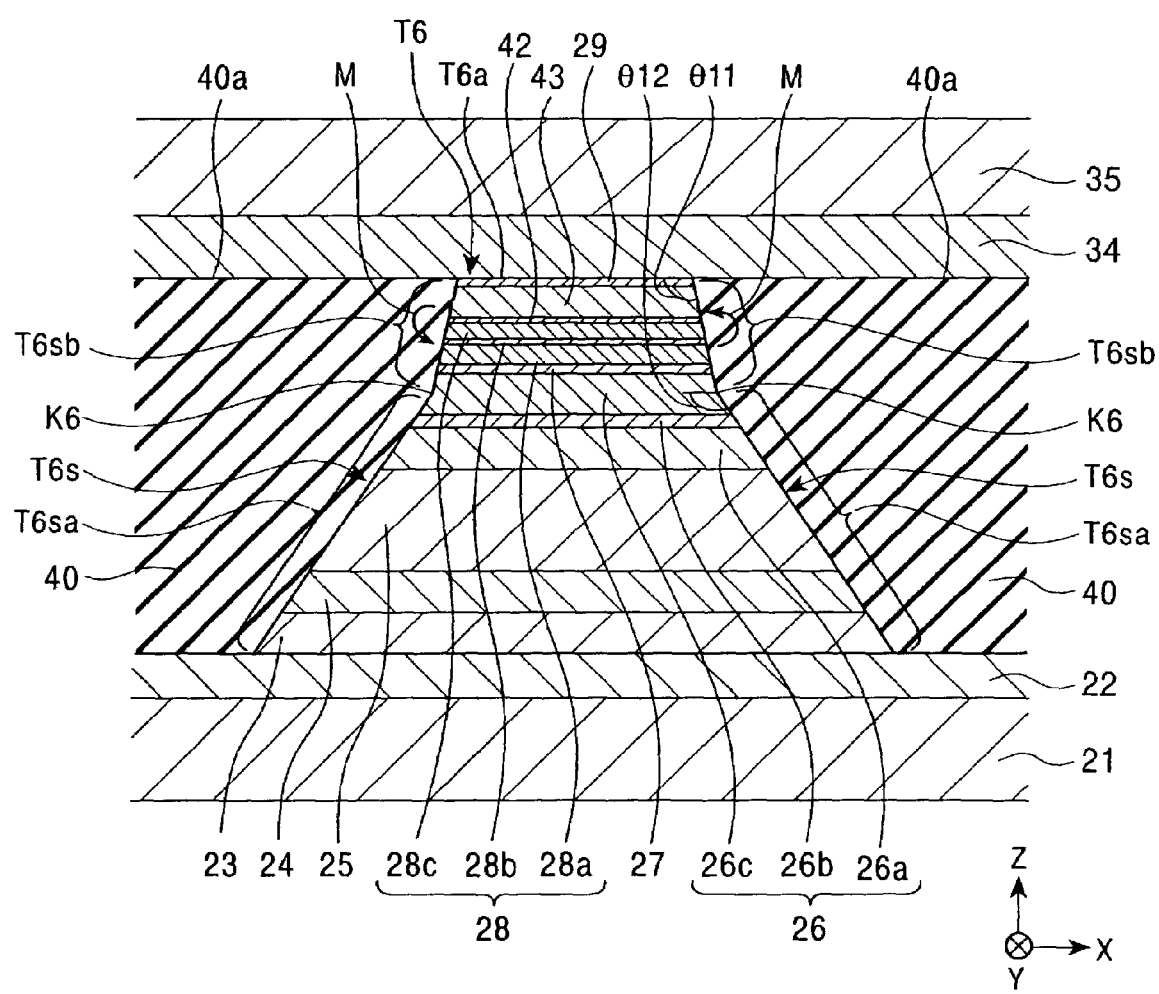
FIG. 6 is a cross-sectional view of a magnetic sensing element according to a sixth embodiment of the present invention.

FIG. 6 is a partial cross-sectional view, viewed from an opposing face, of a magnetic sensing element according to a sixth embodiment of the present invention. This magnetic sensing element is different from those shown in FIGS. 1 to 4 in that a nonmagnetic spacing layer 42 is formed on the free magnetic layer 28 and a ferromagnetic in-stack bias layer 43 is formed on the spacing layer 42 whereas no hard bias layer is formed on the side faces of a composite film T6.

In layers below the spacing layer 42, this magnetic sensing element has the same configuration as those shown in FIG. 1 to 4. That is, the composite film T6 includes an underlayer 23, a seed layer 24, an antiferromagnetic layer 25, a synthetic ferri-pinned type pinned magnetic layer 26 (a first pinned magnetic sublayer 26a, a nonmagnetic interlayer 26b, and second pinned magnetic sublayer 26c), a nonmagnetic layer 27, and a synthetic ferri-free type free magnetic layer 28 (a second free magnetic sublayer 28a, a nonmagnetic interlayer 28b, and a first free magnetic sublayer 28c) below the spacing layer 42.

In this magnetic sensing element, magnetostatic coupling M occurs between each end of the in-stack bias layer 43 and each end of the free magnetic layer 28 and orients the magnetization of the free magnetic layer 28 in the same direction. In FIG. 6, the magnetostatic coupling M occurs between the first free magnetic sublayer 28c and the in-stack bias layer 43 since the first free magnetic sublayer 28c of the free magnetic layer 28 is closer to the in-stack bias layer 43. As a result, the magnetization of the first free magnetic sublayer 28c is aligned in the X direction in the drawing while the magnetization of the second free magnetic sublayer 28a is oriented in a direction antiparallel to the X direction in the drawing. The magnetization of the free magnetic layer 28 is represented by a synthetic magnetic thickness (Msxt) that is the sum of the magnetic thickness of the first free magnetic sublayer 28c and the magnetic thickness of the second free magnetic sublayer 28a.

The configurations shown in FIGS. 1 to 4 exhibit the following disadvantage: A demagnetizing field is formed in the free magnetic layer (buckling phenomenon) caused by the hard bias layers provided on both side faces of the composite film, and insensitive regions are formed by insufficient inversion of the magnetization of the free magnetic layer 28 at side faces. In this embodiment, the in-stack bias layer 43 with the spacing layer 42 provided on the free magnetic layer 28 prevents this disadvantage. Thus, the magnetization of the free magnetic layer 28 can be easily aligned in the single domain state and can sensitively rotate in response to an external magnetic field. The resulting magnetic sensing element has high reading sensitivity and can output symmetric output signals.

In the magnetic sensing element shown in FIG. 6, the side faces of the free magnetic layer 28 are flush with the side faces of the spacing layer 42 and the side faces of the in-stack bias layer 43 in the track width direction. As a result, stable magnetostatic coupling occurs between the in-stack bias layer 43 and the free magnetic layer 28 and the magnetization of the free magnetic layer 28 is easily aligned in the single domain state. Preferably, the in-stack bias layer 43 has a thickness in the range of 50 to 300 Å.

Also in the magnetic sensing element shown in FIG. 6, the angle $\theta 12$ defined between the top face T6a and the side faces T6sa below the bent position K6 of the composite film T6 is larger than the angle $\theta 11$ defined between the top face T6a and the side faces T6sb above the bent position K6. Thus, the upper faces 40a of the insulating layers 40 can be formed so as to be flush with the top face T6a of the composite film T6. Hence, the upper electrode layer 34 formed on the flat surface has a precisely flat surface. Thus, no electrical short-circuiting occurs between the side face T6s of the composite film T6 and the upper electrode layer 34. Since a change in contact area between the composite film T6 and the upper electrode layer 34 is reduced to a small level, the resulting magnetic sensing element exhibits a precise magnetic sensitivity.

Figure 7:
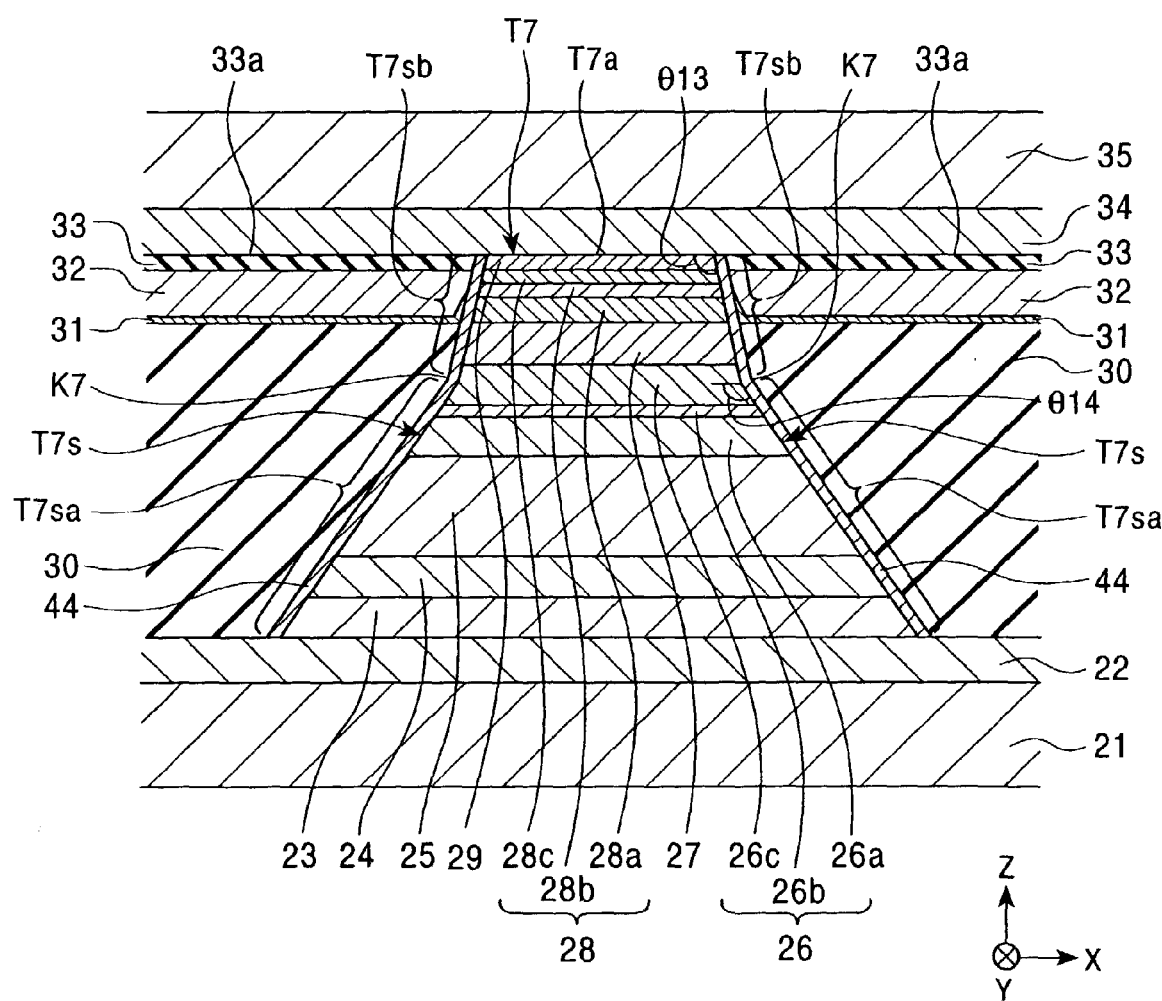
FIG. 7 is a cross-sectional view of a magnetic sensing element according to a seventh embodiment of the present invention.

FIG. 7 is a partial cross-sectional view, viewed from an opposing face, of a magnetic sensing element according to a seventh embodiment of the present invention. This magnetic sensing element is different from those shown in FIGS. 1 to 4 in that specular layers (mirror reflection layers) 44 are provided on side faces T7s of a composite film T7. The specular layer 44 mirror-reflects conduction electrons flowing in the composite film T7 without change in the spin states such as energy and a quantum state.

Figure 8:
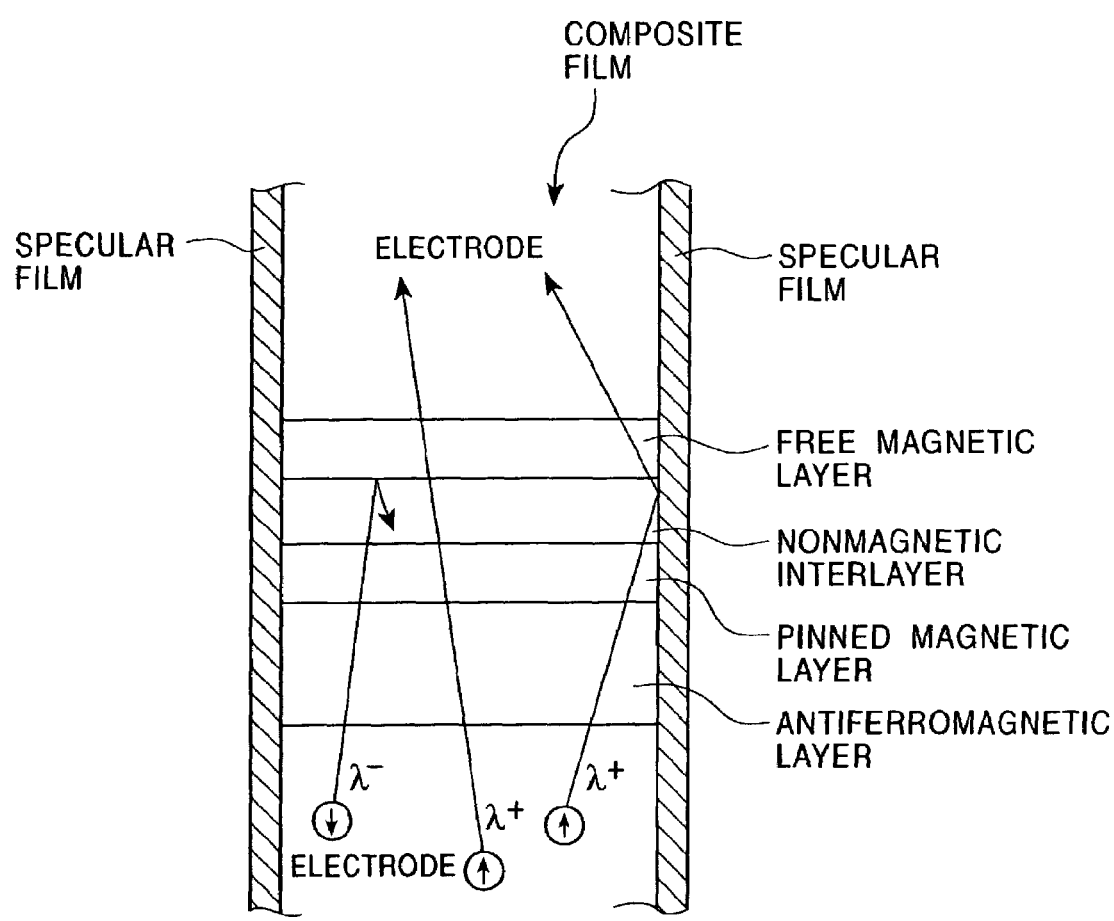
FIG. 8 is a schematic illustration of a specular effect of a specular film.

The mirror reflection effect of the specular layers 44 will now be described with reference to FIG. 8 that schematically shows a part of the magnetic sensing element in this embodiment. Spin-up electrons (represented by upwards arrow in the drawing) can pass through the pinned magnetic layer, the nonmagnetic interlayer, and the free magnetic layer when the magnetization of the pinned magnetic layer is parallel to the magnetization of the free magnetic layer.

When the area of the element is less than 60 nm squares with a decrease in track width Tw, some of the spin-up electrons collide with the side faces of the composite film before they reach the free magnetic layer. The specular layers provided on the side faces of the composite layers mirror-reflect the spin-up electrons colliding with the side faces without change in the spin states such as energy and a quantum state. The mirror-reflected spin-up electrons pass through the free magnetic layer.

Thus, the mean free path $\lambda+$ of the spin-up conduction electrons increases despite a decreased area of the element. As a result, a difference between the mean free path $\lambda+$ of the spin-up electrons and the mean free path $\lambda-$ of the spin-down electrons increases, resulting in improved read output and a rate of change in resistance ($\Delta R/R$).

The reason for mirror reflection of the conduction electrons on the specular layers is that a potential barrier is formed in the vicinity of the interface between each of the side faces of the composite layer and the corresponding specular layer.

When the magnetization of the second free magnetic sublayer 28a is parallel to the magnetization of the first free magnetic sublayer 28c in the magnetic sensing element shown in FIG. 7, spin-up conduction electrons can pass through the second free magnetic sublayer 28a. When the track width defined by the width of the upper face of the free magnetic layer 28 decreases, the proportion of conduction electrons colliding with the side faces T7s of the composite film T7 increases; however, these conduction electrons are mirror-reflected by the specular layers 44 and pass through the second free magnetic sublayer 28a. Thus, the mean free path $\lambda+$ of the spin-up conduction electrons increases in an element having a reduced area, resulting in improved read output and a rate of change in resistance ($\Delta R/R$).

The specular layer 44 may be formed on the entire side faces T7s of the composite film T7 as shown in FIG. 7 or may be formed at least over the side faces of the pinned magnetic layer 26 to the free magnetic layer 28.

The specular layers 44 are preferably composed of an oxide selected from Fe—O, Ni—O, Co—O, Co—Fe—O, Co—Fe—Ni—O, Al—O, Al-Q-O, or R—O, wherein Q is at least one element selected from the group consisting of B, Si, N, Ti, V, Cr, Mn, Fe, Co, and Ni, and R is elected from the group consisting of Cu, Ti, V, Cr, Zr, Nb, Mo, Hf, Ta, and W. Preferably, the F—O is $\alpha$-Fe$_2$O$_3$, the Al-Q-O is AlQO, and the R—O is RO.

The oxide layer is formed as follows: A layer composed of an element or elements is formed on each side face T7s of the composite film T7 by sputtering using a target of the corresponding element, and is oxidized by spontaneous oxidation, plasma oxidation, or radical oxidation. It is important that the element is entirely oxidized to form the specular layers 44 having a high specular effect (mirror reflection effect).

Although the specular layers 44 preferably have a stoichiometric composition, these layers exhibit the specular effect even if the stoichiometric ratio is not satisfied. Specular layers 44 having high insulation form adequate potential barriers at the interface to the free magnetic layer 28 and exhibit the specular effect even if these layers does not satisfy the stoichiometric ratio.

For example, Al—O specular layers 44 formed by sputtering using an Al$_2$O$_3$ target do not have a stoichiometric ratio; however, an adequate potential barrier can be formed in the vicinity of the interface between each specular layer 44 and the free magnetic layer 28 when oxygen content in the target is extremely low.

Alternatively, the specular layers 44 may be composed of a nitride selected from Al—N, Al-Q-N, and R—N wherein Q is at least one element selected from the group consisting of B, Si, O, Ti, V, Cr, Mn, Fe, Co, and Ni, and R is elected from the group consisting of Ti, V, Cr, Zr, Nb, Mo, Hf, Ta, and W. Preferably, the Al—N is AlN, the Al-Q-N is AlQN, and the R—N is RN.

The nitride is formed as follows: A layer composed of an element or elements or elements is formed on each side face T7s of the composite film T7 by sputtering using a target of the corresponding element, and is nitrided.

Alternatively, the specular layers 44 may be composed of a Heusler semimetal alloy. Examples of the Heusler semimetal alloys include NiMnSb and PtMnSb.

Also in the magnetic sensing element shown in FIG. 7, the angle θ14 defined between the top face T7a and the side faces T7sa below the bent position K7 of the composite film T7 is larger than the angle θ13 defined between the top face T7a and the side faces T7sb above the bent position K7. Thus, the upper faces 33a of the insulating layers 33 can be formed so as to be flush with the top face T7a of the composite film T7. Hence, the upper electrode layer 34 formed on the flat surface has a precisely flat surface. Thus, no electrical short-circuiting occurs between the side face T7s of the composite film T7 and the upper electrode layer 34. Since a change in contact area between the composite film T7 and the upper electrode layer 34 is reduced to a small level, the resulting magnetic sensing element exhibits a precise magnetic sensitivity.

Since the tilt of the side faces T7sa is gentle below the bent positions K7 in the magnetic sensing element shown in FIG. 7, the specular layer 44 can be uniformly formed on the side faces T7sa.

In each of the magnetic sensing elements shown in FIGS. 1 to 7, the lower shield layer 21, the upper shield layer 35, the electrode layer 22, and the upper electrode layer 34 are composed of different materials. Alternatively, the electrode layer 22 may be composed of a soft magnetic material used in the lower shield layer 21, or the upper electrode layer 34 may be composed of a soft magnetic material used in the upper shield layer 35.

Figure 9:
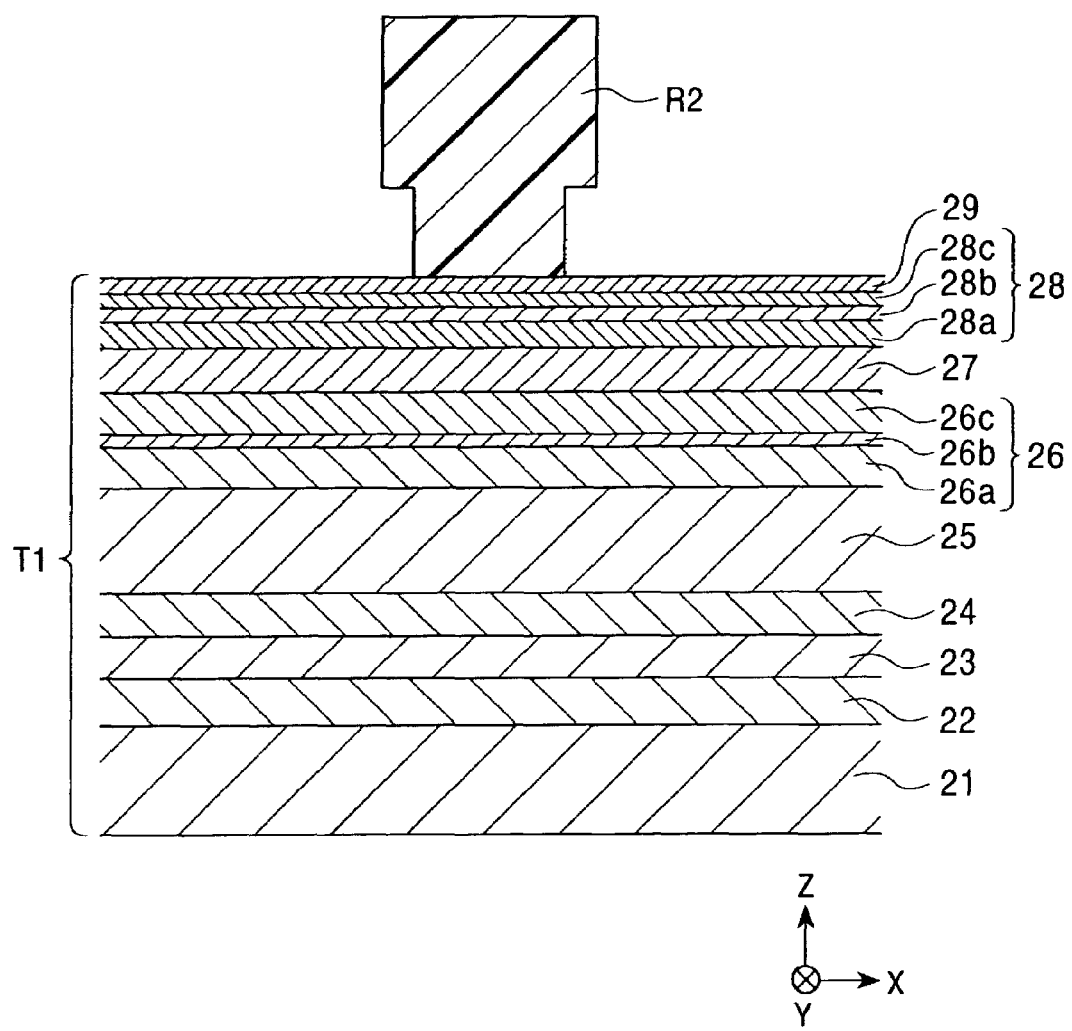
FIG. 9 is a cross-sectional view of a step of making a magnetic sensing element according to an embodiment of the present invention.

A method for making the magnetic sensing element shown in FIG. 1 will now be described. Referring to FIG. 9, layers for the composite film T1, i.e., the lower shield layer 21, the electrode layer 22, the underlayer 23, the seed layer 24, the antiferromagnetic layer 25, the first pinned magnetic sublayer 26a, the nonmagnetic interlayer 26b, the second pinned magnetic sublayer 26c, the nonmagnetic layer 27, the second free magnetic sublayer 28a, the nonmagnetic interlayer 28b, the first free magnetic sublayer 28c, and the protective layer 29 are formed on an aluminum under layer (not shown) provided on a substrate (not shown). The materials for these materials have been described above. These layers are formed by, for example, a sputtering process. Examples of sputtering processes include a DC magnetron sputtering process, an RF magnetron sputtering process, an ion beam sputtering process, a long throw sputtering process, and a collimation sputtering process. These processes may be employed alone or in combination.

A resist layer R2 is formed on the protective layer 29. Preferably, the width W1 of the resist layer R2 in the track width direction (X direction in the drawing) is substantially the same as the track width Tw defined by the width of the upper face of the free magnetic layer 28.

Figure 10:
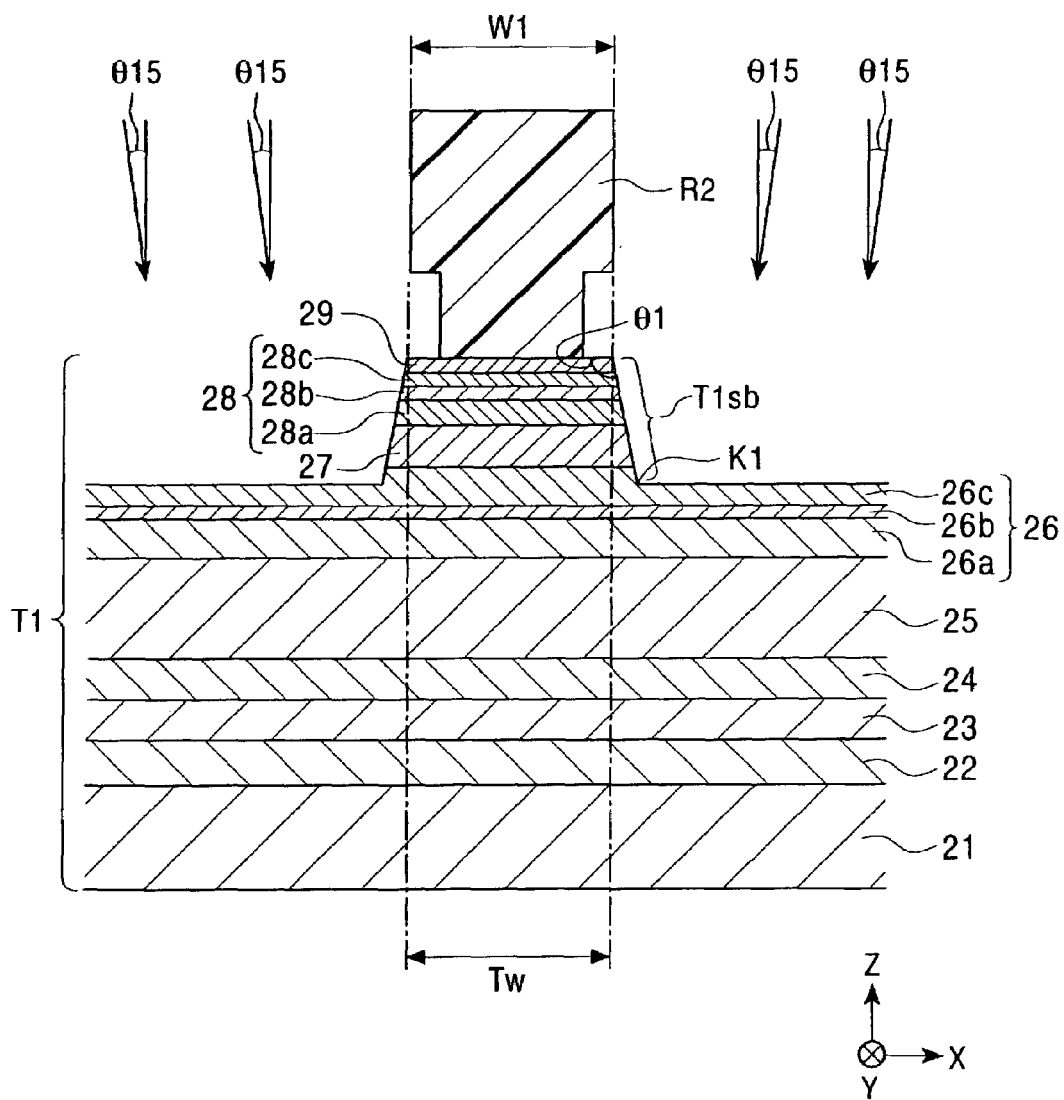
FIG. 10 is a cross-sectional view of another step of making a magnetic sensing element according to an embodiment of the present invention.

Referring to FIG. 10, the uncovered regions of the composite film T1 are etched away by ion milling at a first incidental angle θ15 to the normal line of the top face T1a until the etching depth reaches the midway of the second pinned magnetic sublayer 26c.

The final etching point may be determined at any position below the free magnetic layer 28 in the present invention. For example, the composite film T1 may be etched away until the etching depth reaches the midway of the nonmagnetic layer 27, the antiferromagnetic layer 25, the electrode layer 22, or the lower shield layer 21. Side faces T1sb above bent positions K1 of the composite film T1 are thereby formed.

Figure 11:
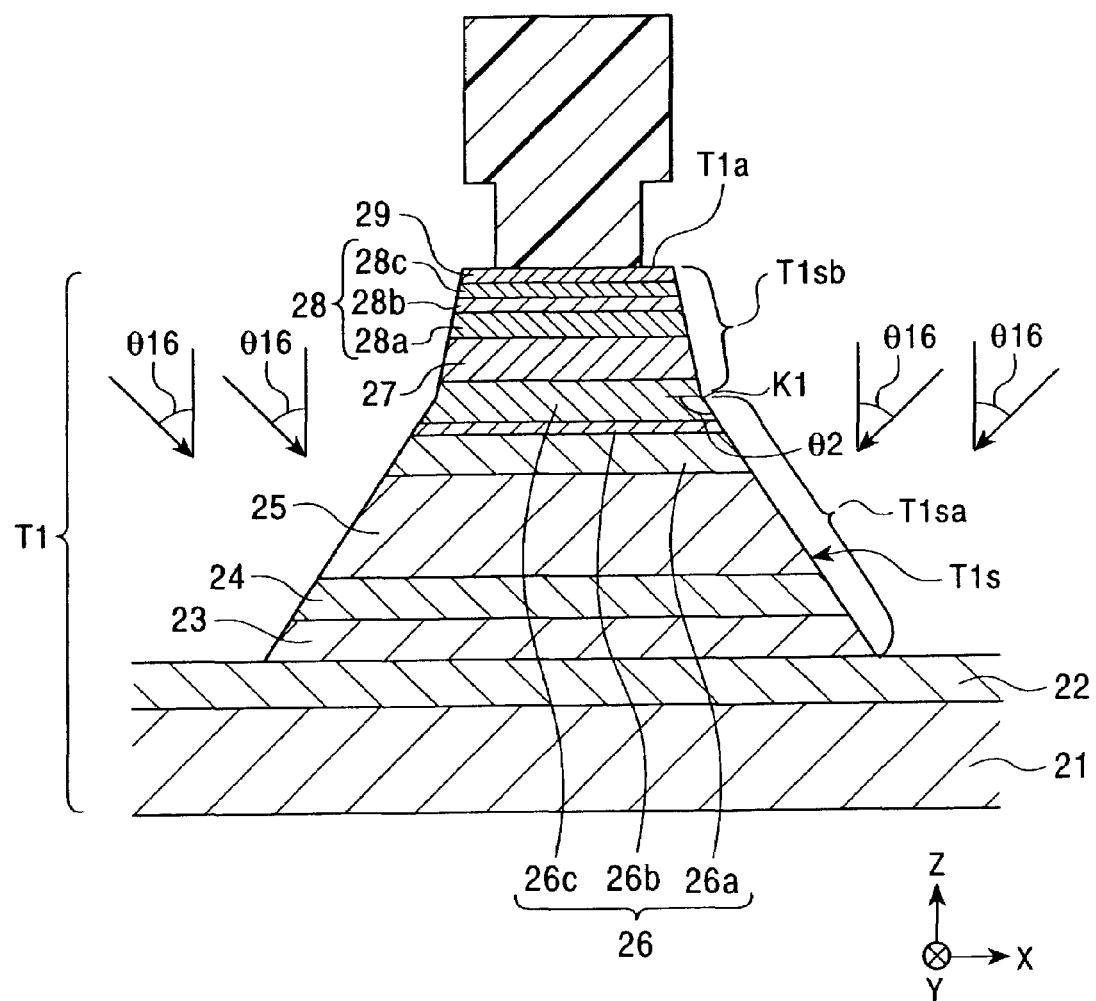
FIG. 11 is a cross-sectional view of another step of making a magnetic sensing element according to an embodiment of the present invention.

Referring to FIG. 11, the composite film T1 from the midway of the second pinned magnetic sublayer 26c to the underlayer 23 is etched away by ion milling at a second incident angle θ16 to the normal line of the top face T1a, the second incident angle θ16 being larger than the first incidental angle θ15. In the present invention, the etching may be performed to the midway of the antiferromagnetic layer 25, seed layer 24, underlayer 23, electrode layer 22, or lower shield layer 21. Side faces T1sa below bent positions K1 of the composite film T1 is thereby formed.

For example, the first incidental angle θ15 is in the range of 5° to 20° whereas the second incident angle θ16 is in the range of 45° to 60°. Before the milling at the second incident angle θ16, contaminants deposited on the side faces T1s of the composite film T1 may be removed.

Figure 12:
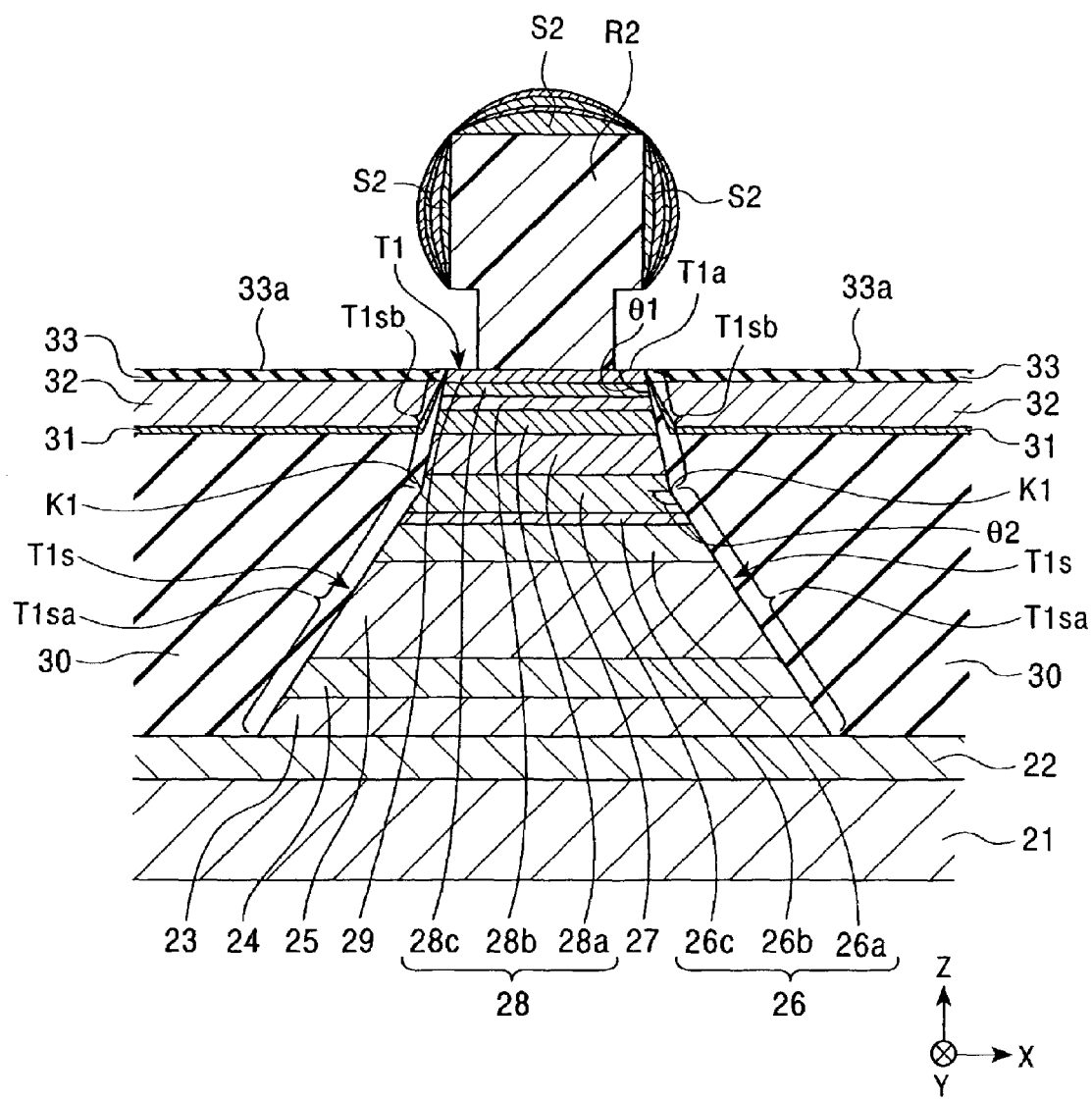
FIG. 12 is a cross-sectional view of another step of making a magnetic sensing element according to an embodiment of the present invention.

Referring to FIG. 12, the insulating layers 30, the bias underlayers 31, the hard bias layers 32, and the insulating layers 33 are formed in that order on the electrode layer 22 at the side faces of the composite film T1 by an isotropic or anisotropic sputtering process. An anisotropic sputtering process i.e., a long throw sputtering process or ion beam sputtering process, is preferable in order to reduce deposition of sputtered materials below the resist layer R2 and to prevent the formation of fins at a lift-off stage.

Preferably, the insulating layers 30 are formed so as to cover the entire side faces T1s of the composite film T1 for complete electrical insulation of the side faces T1s ranging from the underlayer 23 to the protective layer 29.

In the sputtering process shown in FIG. 12, layers S2 corresponding to a laminate of the insulating layer 30, bias underlayer 31, hard bias layer 32, and insulating layer 33 are also formed on the top face and side faces of the resist layer R2.

The sputtering conditions for forming the insulating layers 33 are as follows: The temperature of the substrate is in the range of 0 to 100°C., the distance between the substrate and the target is in the range of 100 to 300 mm, and the Ar gas pressure is in the range of $10^{-5}$ to $10^{-3}$ Torr ($1.3 \times 10^{-3}$ to 0.13 Pa).

Figure 13:
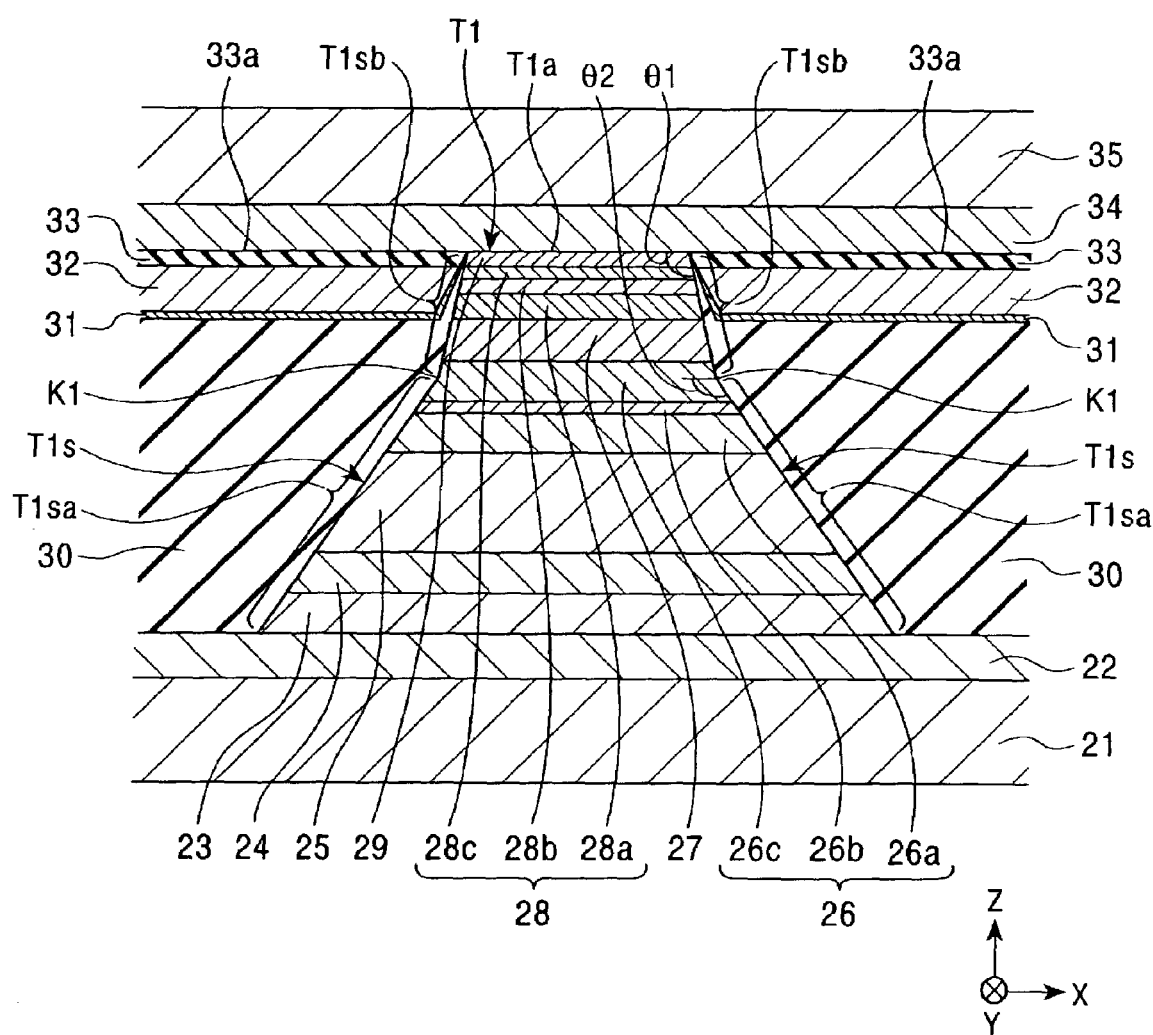
FIG. 13 is a cross-sectional view of another step of making a magnetic sensing element according to an embodiment of the present invention.

Referring to FIG. 13, the resist layer R2 is removed, then the upper electrode layer 34, and the upper shield layer 35 are formed by sputtering or plating on the top face T1a of the composite film T1. The materials for the insulating layers 30, the bias underlayers 31, the hard bias layers 32, the insulating layers 33, the upper electrode layer 34, and the upper shield layer 35 are described in the first embodiment shown in FIG. 1.

The insulating layers 30 insulate the side face T1s of the composite film T1 from the electrode layer 22. Furthermore, the insulating layers 30 and the insulating layers 33 insulate the side faces T1s of the composite film T1 from the upper electrode layer 34.

In this method, the ion milling angle for forming the side faces T1s varies between the upper portion and the lower portion to a predetermined position. As a result, the θ2 defined by the side faces T1sa below the bent positions K1 and the top face T1a of the composite film T1 is larger than the θ1 defined by the side faces T1sb above the bent positions K1 and the top face T1a of the composite film T1.

In such a configuration, the side faces T1sa below the bent position K1 function as raising layers when the insulating layers 30, the bias underlayers 31, the hard bias layers 32, and the insulating layers 33 are formed on the lower electrode layer 22 at both sides of the composite film T1. The raising layers prevent the formation of dents between the side faces T1s of the composite film T1 and the insulating layers 33. Thus, short-circuiting does not occur between the upper electrode layer 34 and the composite film T1 at the side faces T1s. Since a variation in electrically connecting area between the composite film T1 and the upper electrode layer 34 can be suppressed at a predetermined level or less, the magnetic sensing element has a sensitivity with reduced variation. Furthermore, the thickness of the insulating layers 33 can be reduced so that no fin is formed on the insulating layers 33.

As shown in FIG. 12, the uppermost insulating layers 33 at both the sides of the composite film T1 have flat surfaces 33a that are flush with the top face T1a of the composite film T1 in this method. Thus, the upper electrode layer 34 formed on the flush surfaces also has a precisely flat surface. In this method, the flat surfaces 33a flush with the top face T1a of the composite film T1 can be formed merely by forming the insulating layers 30, the bias underlayers 31, the hard bias layers 32, and the insulating layers 33 by a sputtering process. Since no planarizing process such as CMP is required, the surface of the composite film T1 is smooth and securely connects with the upper electrode layer 34.

Furthermore, the thickness of the insulating layers 33 for insulating the side faces T1s of the composite film T1 from the upper electrode layer 34 can be reduced so that no fin is formed on the insulating layers 33.

The layers (the nonmagnetic interlayer 26b, the first pinned magnetic sublayer 26a, the antiferromagnetic layer 25, the seed layer 24, and the underlayer 23) below the bent positions K1 have significantly large widths in the track width direction compared with the layers (the nonmagnetic layer 27, the free magnetic layer 28, and the protective layer 29) above the bent positions K1. Since the bent positions K1 lie below the free magnetic layer 28, this configuration prevents a significant increase in width of the free magnetic layer 28 in the track width direction.

When the top-spin magnetic sensing element shown in FIG. 4 is formed, the free magnetic layer 28, the nonmagnetic layer 27, the pinned magnetic layer 26, and the antiferromagnetic layer 25 are formed in that order from the bottom in the forming process of the composite film shown in FIG. 9.

When the top-spin magnetic sensing element shown in FIG. 5 is formed, the step shown in FIG. 11 is performed, and the insulating layers 40 are formed on the entire side faces of the composite film T1 so that the top face T1a of the composite film T1 is flush with the surfaces 40a of the insulating layers 40. Next, the exchange bias layers 41 composed of an antiferromagnetic material are formed over the insulating layers 40 and both ends of the free magnetic layer 28. In this magnetic sensing element, the exchange anisotropic magnetic field generated between the antiferromagnetic layer 25 and the first pinned magnetic sublayer 26a must be perpendicular to the exchange anisotropic magnetic field generated between the first free magnetic sublayer 28c and the exchange bias layer 41.

A method for achieving the perpendicular arrangement of these exchange anisotropic magnetic fields is as follows: After the exchange bias layers 41 are formed, a first magnetic field is applied to the composite in a direction perpendicular to the track width direction while the composite is annealed at a first heating temperature to generate exchange coupling magnetic fields in the antiferromagnetic layer 25 and the exchange bias layers 41, the exchange coupling magnetic field of the antiferromagnetic layer 25 being larger than that of the exchange bias layer 41. These exchange coupling magnetic fields align the magnetizations of the pinned magnetic layer and the free magnetic layer in the perpendicular directions. Next, a second magnetic field that is larger than the exchange coupling magnetic field of the exchange bias layer 41 and is smaller than the exchange coupling magnetic field of the antiferromagnetic layer 25 is applied in the track width direction, while the composite is annealed at a second heating temperature that is higher than the first heating temperature to generate an exchange bias magnetic field, perpendicular to the magnetization of the pinned magnetic layer, in the free magnetic layer.

When the magnetic sensing element shown in FIG. 6 is formed, in the step shown in FIG. 9, the nonmagnetic spacing layer 42 and the ferromagnetic in-stack bias layer 43 are formed on the free magnetic layer 28.

When the magnetic sensing element shown in FIG. 7 is formed, after the step shown in FIG. 11, the specular layers 44 are formed on the side faces T7s of the composite film T7 in the track width direction. The incident angle of the sputtered particles when the specular layers 44 are formed is preferably in the range of 20° to 70° to the normal line of the composite film T7. Thereby, the specular layers 44 can be readily and precisely formed on the side faces T7s. For example, the sputtering conditions for forming the specular layers 44 are as follows: The temperature of the substrate is in the range of 20° C. to 100° C.; the distance between the substrate and the target is in the range of 100 to 300 mm; and the Ar gas pressure is in the range of $10^{-5}$ to $10^{-3}$ Torr ($1.3 \times 10^{-3}$ to 0.13 Pa).

The specular layers 44 are preferably composed of an oxide selected from Fe—O, Ni—O, Co—O, Co—Fe—O, Co—Fe—Ni—O, Al—O, Al-Q-O, or R—O, wherein Q is at least one element selected from the group consisting of B, Si, N, Ti, V, Cr, Mn, Fe, Co, and Ni, and R is elected from the group consisting of Cu, Ti, V, Cr, Zr, Nb, Mo, Hf, Ta, and W. Preferably, the F—O is $\alpha$-$Fe_2O_3$, the Al-Q-O is AlQO, and the R—O is RO.

The oxide layer may be formed by directly depositing oxide using an oxide target. An alternative method for forming the oxide layer is as follows: A layer composed of an element or elements is formed on each side face T7s of the composite film T7 by sputtering using a target of the corresponding element. For example, a Ta layer is formed on each side face T7s by sputtering using a Ta target. The Ta layer is oxidized by, for example, spontaneous oxidation, plasma oxidation, or radical oxidation.

The specular layers 44 prepared in the oxidation step substantially have a stoichiometric composition, and form satisfactory potential barriers for the composite film T7. Thus, the specular layers 44 exhibit a high specular effect.

Alternatively, the specular layers 44 may be composed of a nitride selected from Al—N, Al-Q-N, and R—N wherein Q is at least one element selected from the group consisting of B, Si, O, Ti, V, Cr, Mn, Fe, Co, and Ni, and R is elected from the group consisting of Ti, V, Cr, Zr, Nb, Mo, Hf, Ta, and W. Preferably, the Al—N is AlN, the Al-Q-N is AlQN, and the R—N is RN.

The nitride specular layers 44 are formed as follows: A layer composed of an element or elements is formed on each side face T7s of the composite film T7 by sputtering using a target of the corresponding element, and is nitrided.

Alternatively, the specular layers 44 may be composed of a Heusler semimetal alloy. Examples of the Heusler semimetal alloys include NiMnSb and PtMnSb. The Heusler semimetal specular layers 44 preferably formed by sputtering.

Since the resist layer R2 is covered by the materials constituting the insulating layers 33 and the like, the resist layer R2 cannot be removed easily with a solvent in some cases. Thus, these materials are removed by a scrubbing process from the resist layer R2 until the resist layer R2 is partly exposed, and then the resist layer R2 is dissolved with the solvent. In a typical scrubbing process, dry ice particles are jetted onto the resist layer R2 to remove the materials deposited on the resist layer R2.

Figure 14:
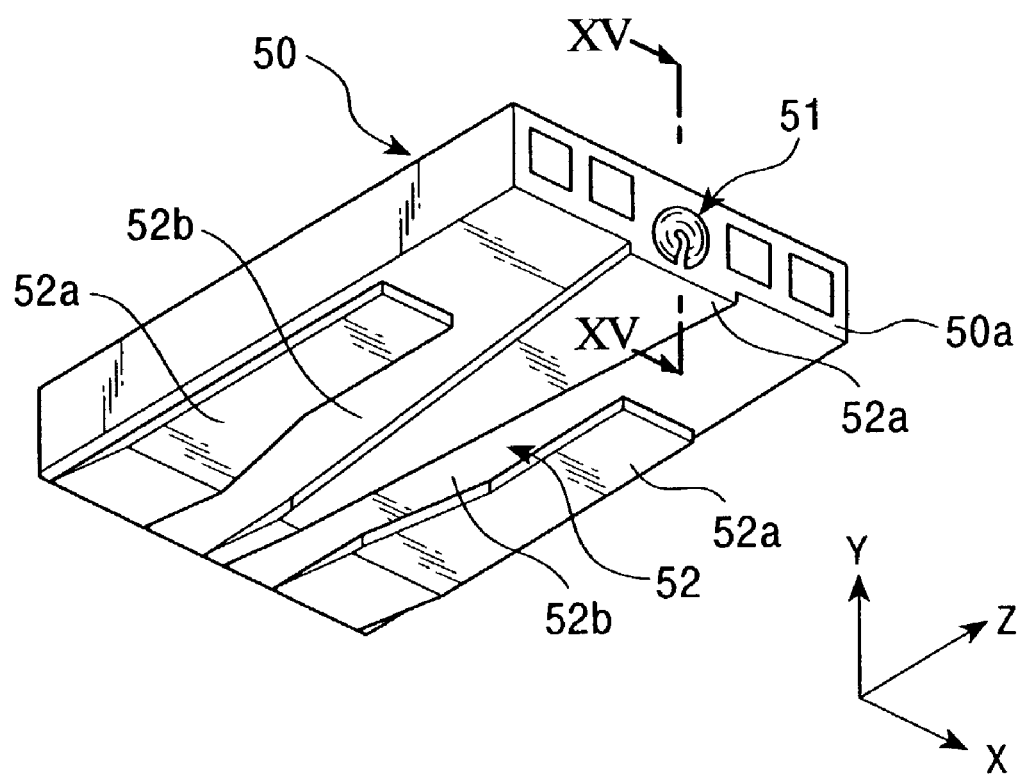
FIG. 14 is an isometric view of a magnetic head including a magnetic sensing element according to the present invention.
Figure 15:
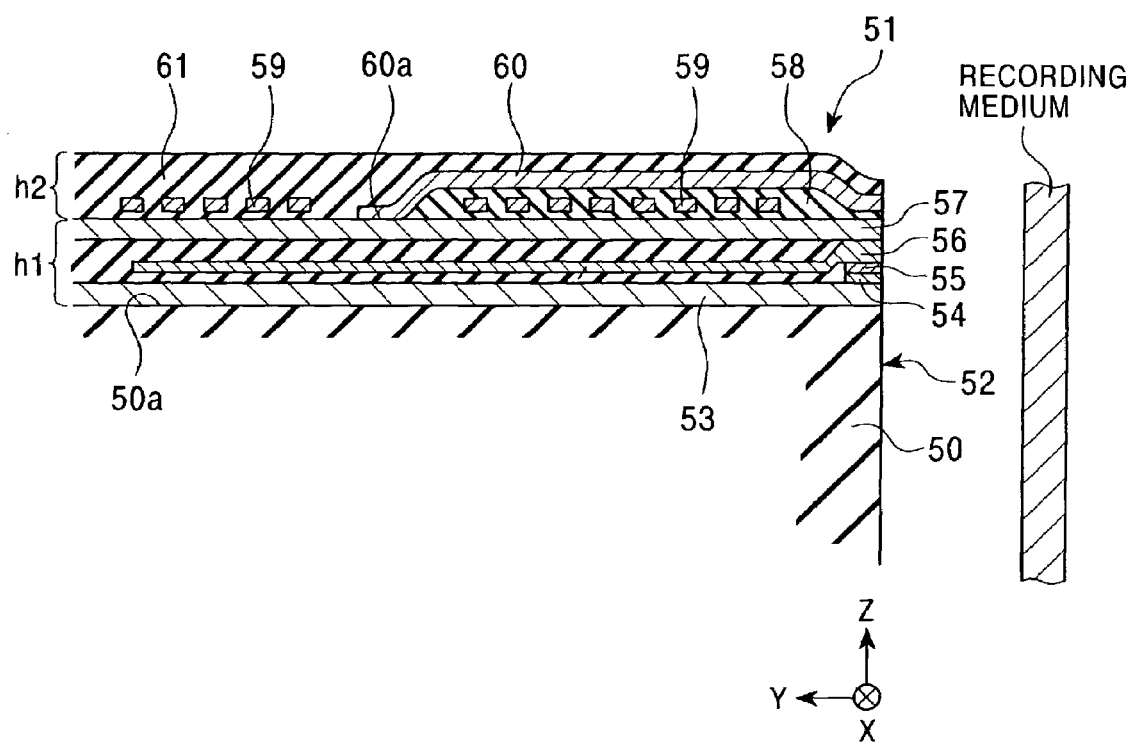
FIG. 15 is a cross-sectional view of the magnetic head shown in FIG. 14.
Figure 16:
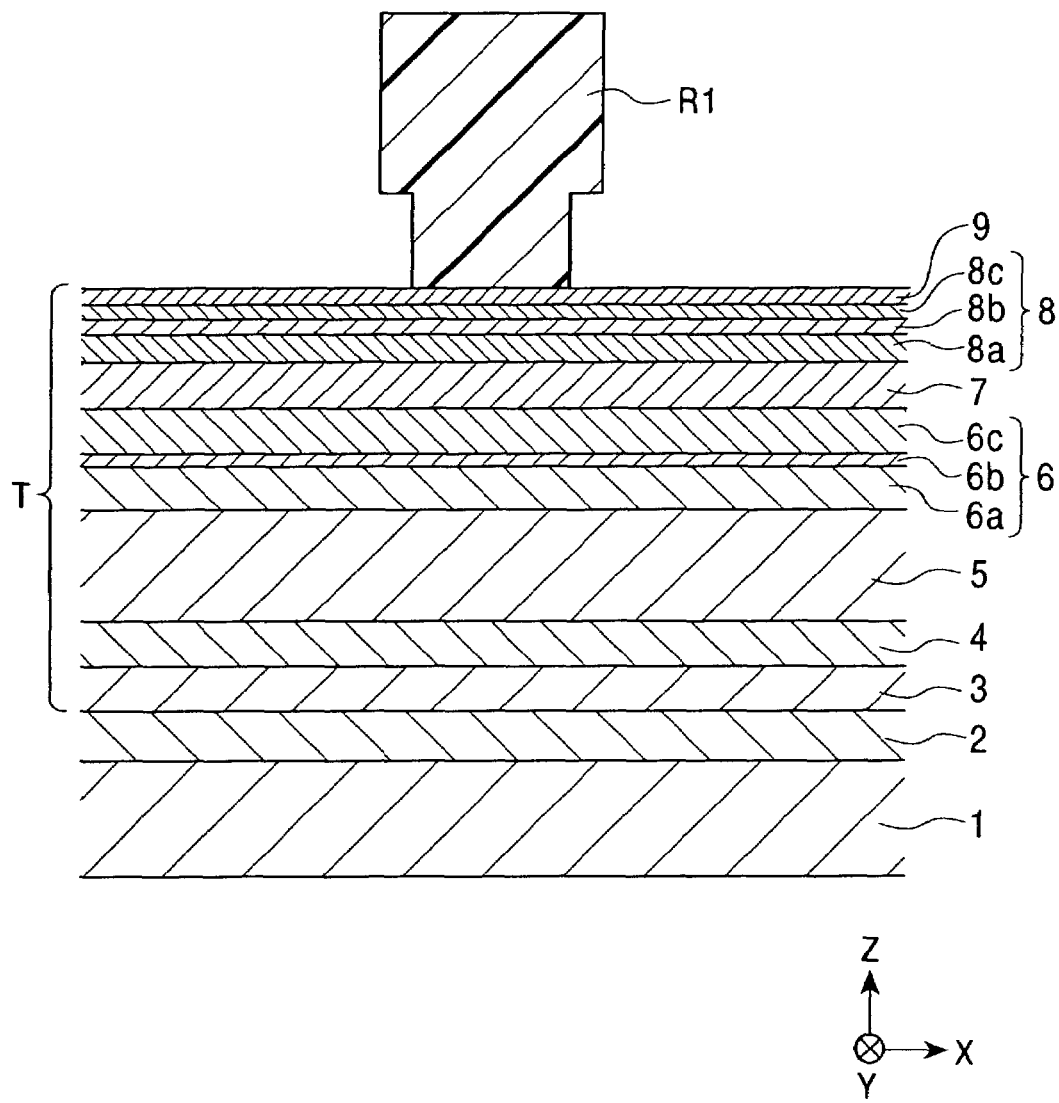
FIG. 16 is a cross-sectional view of a step of making a known magnetic sensing element.
Figure 17:
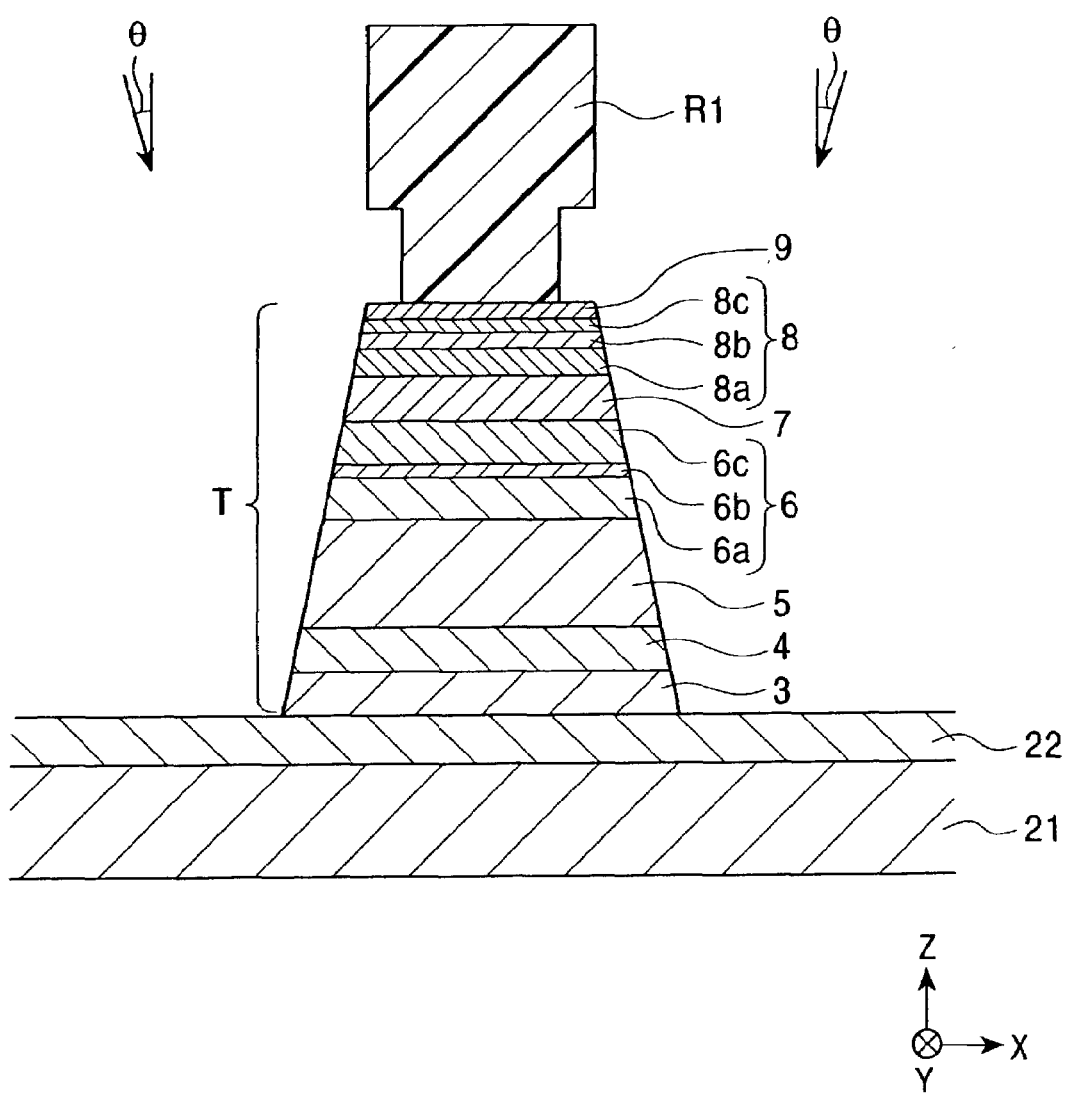
FIG. 17 is a cross-sectional view of another step of making a known magnetic sensing element.
Figure 18:
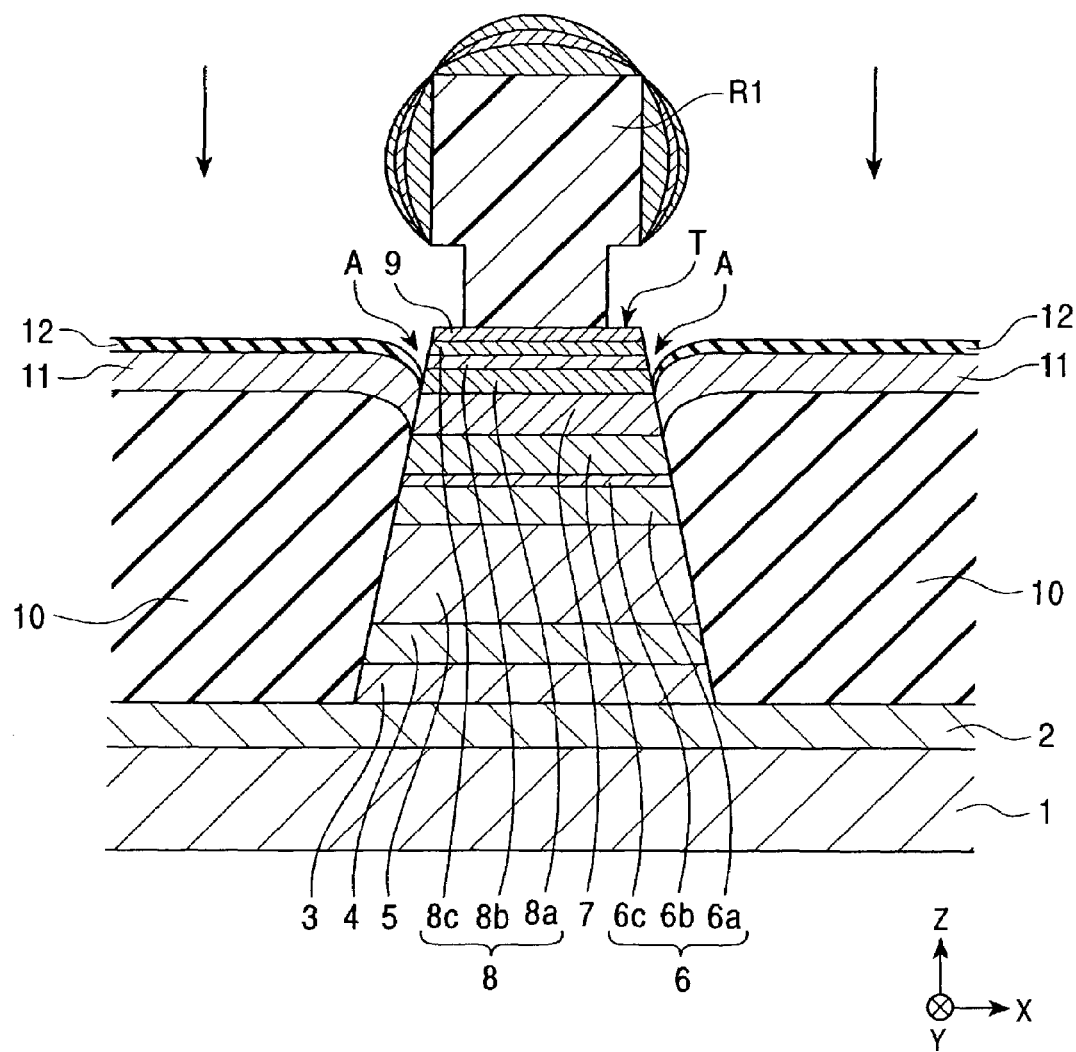
FIG. 18 is a cross-sectional view of another step of making a known magnetic sensing element.
Figure 19:
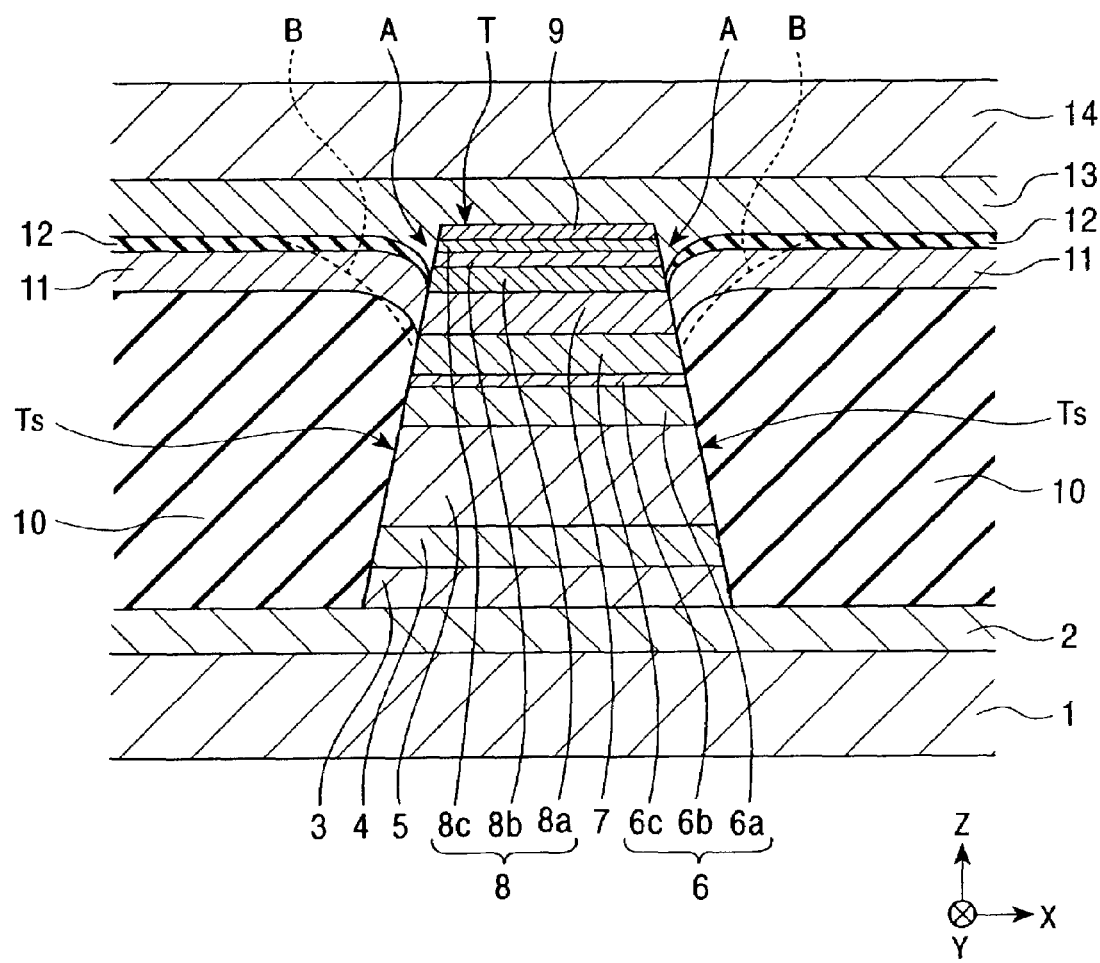
FIG. 19 is a cross-sectional view of a known magnetic sensing element.
Figure 20:
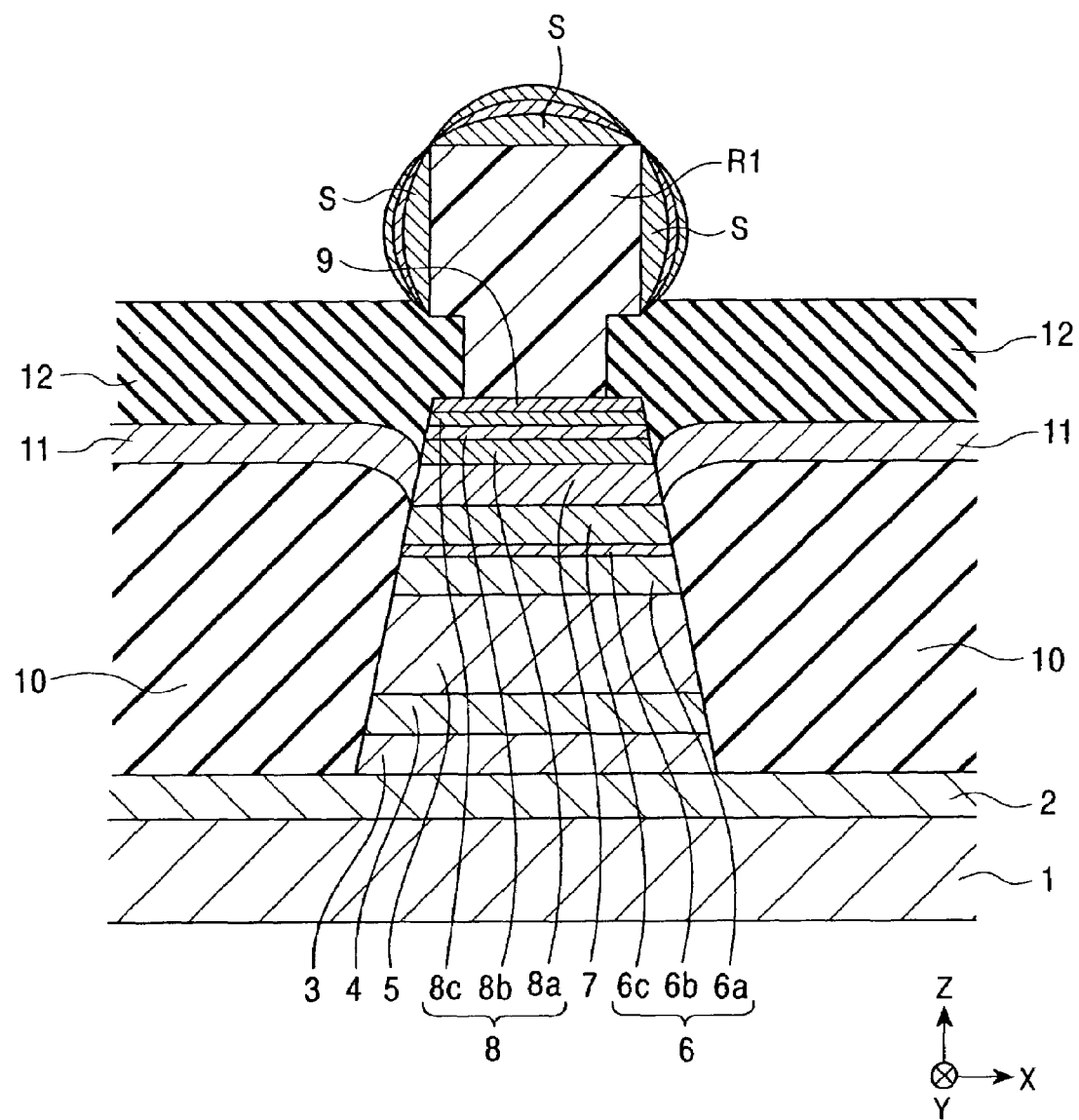
FIG. 20 is a cross-sectional view of another step of making a known magnetic sensing element.
Figure 21:
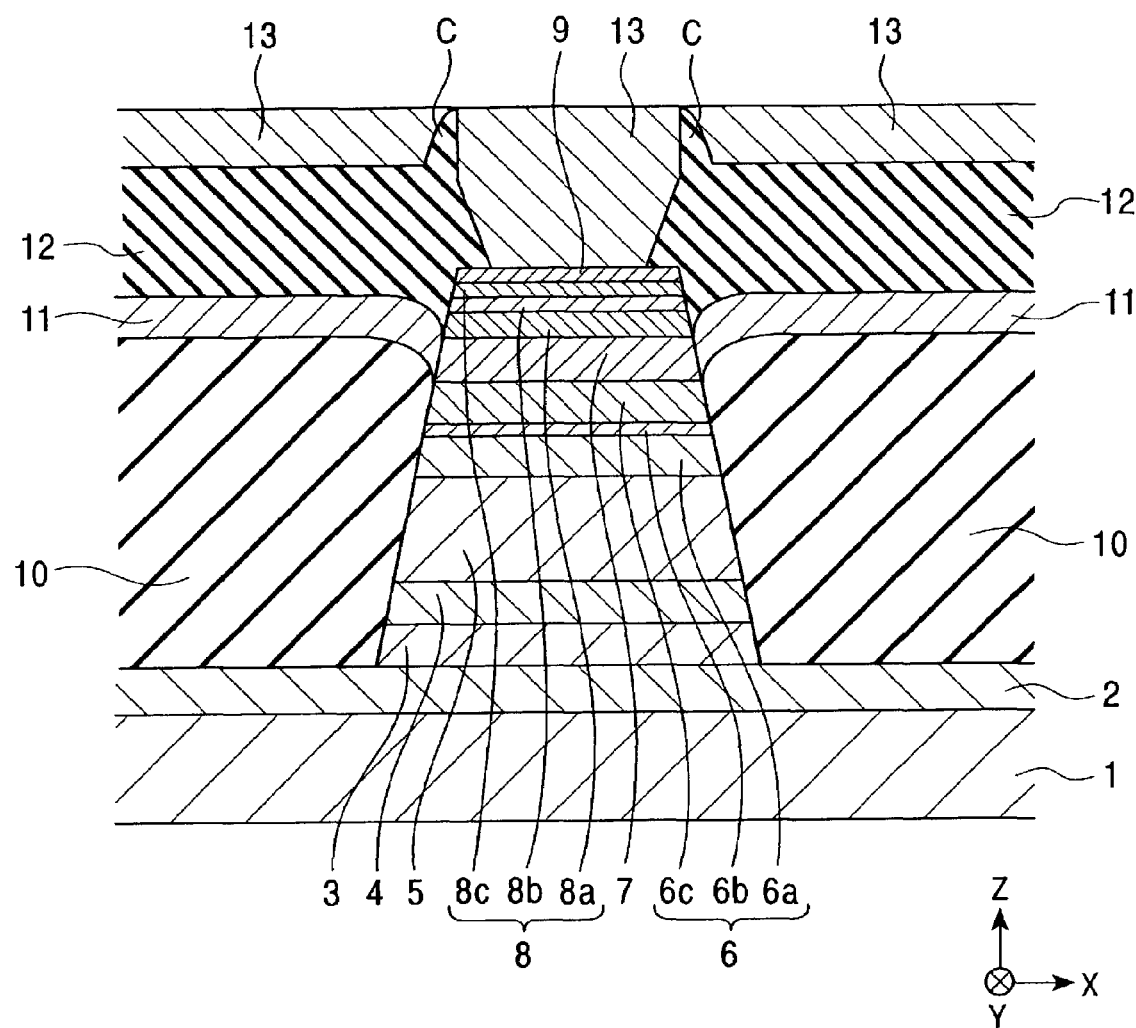
FIG. 21 is a cross-sectional view of another step of making a known magnetic sensing element.

FIG. 14 is an isometric view of a magnetic head including the magnetic sensing element according to the present invention, viewed from the opposing face; and FIG. 15 is a cross-sectional view of the magnetic head taken along line XV—XV shown in FIG. 14. Referring to FIGS. 14 and 15, a GMR head hi including the magnetic sensing element and an inductive head h2 are provided at a trailing side 50a of a slider. The MR head hi detects a recording magnetic field form a magnetic recording medium such as a hard disk and the inductive head h2 records signals onto the magnetic recording medium.

In FIG. 14, a slider 50 has the opposing face (ABS) 52. The opposing face 52 has rails 52a separated by air grooves 52b.

Referring to FIG. 15, the GMR head h1 includes a lower shield layer 53 composed of a magnetic alloy formed on a side 50a of the slider 50, a lower electrode layer 54 on the lower shield layer 53, a magnetic sensing element 55 according to the present invention exposed to the opposing face 52 to the recording medium; an upper electrode layer 56, and an upper shield layer 57 that also functions as a lower core layer of the inductive head h2.

The inductive head h2 includes the lower core layer (upper shield layer) 57, a gap layer 58 on the lower core layer 57, a coil 59, and an upper core layer 60 connecting with the gap layer 58 and the lower core layer 57 at a base 60a. The upper core layer 60 is covered with a protective layer 61 composed of alumina or the like.

In FIGS. 14 and 15, the X direction in the drawing is the track width direction; the Y direction is the height direction that is a direction of a leakage magnetic field from the recording medium; and the Z direction is the moving direction of the recording medium.

In the present invention, the magnetic sensing element may be of a tunneling magnetoresistive type. In the tunneling magnetoresistive type, the nonmagnetic layer 27 is composed of an insulating material such as $Al_2O_3$.

The magnetic sensing element according to the present invention is applicable to hard disk drives, heads for reading signals on magnetic tapes, and various magnetic sensors.

Having described our invention as related to the embodiments shown in the accompanying drawings, it is our intention that the invention be not limited by any of the details of description, unless otherwise specified, but rather than be construed broadly within its spirit and scope as set out in the accompanying claims.

What is claimed is:

1. A magnetic sensing element comprising:
   a composite film comprising:
     an antiferromagnetic layer;
     a pinned magnetic layer;
     a nonmagnetic layer; and
     a free magnetic layer; and
   a lower electrode layer and an upper electrode layer for supplying a current perpendicular to the composite film,
     wherein the composite film has a top face and two side faces in a track width direction, each of the two side faces has a bent position, and the angle defined by the side face below the bent position and the top face is larger than the angle defined by the side face above the bent position and the top face.

2. A magnetic sensing element comprising:
   a composite film comprising:
     an antiferromagnetic layer;
     a pinned magnetic layer;
     a nonmagnetic layer; and
     a free magnetic layer;
   a lower shield layer; and
   a lower electrode layer and an upper electrode layer for supplying a current perpendicular to the composite film,
     wherein the composite film has a top face and two side faces in a track width direction, each of the side faces has a bent portion on one of the lower electrode layer and the lower shield layer, and the angle defined by the side face below the bent portion and the top face of the composite film is larger than that defined by the side face above the bent portion and the top face.

3. The magnetic sensing element according to claim 1, further comprising upper insulating layers for electrically insulating the upper electrode layer from the side faces of the composite film.

4. The magnetic sensing element according to claim 3, wherein the upper insulating layers have flat surfaces.

5. The magnetic sensing element according to claim 1, further comprising lower insulating layers on the side faces of the composite film, for electrically insulating the lower electrode layer from the side faces of the composite film.

6. The magnetic sensing element according to claim 1, wherein the antiferromagnetic layer, the pinned magnetic layer, the nonmagnetic layer, and the free magnetic layer are disposed in that order from the bottom.

7. The magnetic sensing element according to claim 6, wherein the bent position lies at the corresponding side face in the track width direction of the pinned magnetic layer.

8. The magnetic sensing element according to claim 6, wherein the bent position lies at the corresponding side face in the track width direction of the antiferromagnetic layer.

9. The magnetic sensing element according to claim 1, wherein the free magnetic layer, the nonmagnetic layer, the pinned magnetic layer, and the antiferromagnetic layer are disposed in that order from the bottom.

10. The magnetic sensing element according to claim 1, further comprising hard bias layers comprising a hard magnetic material, the hard bias layers opposing side faces in the track width direction of at least the free magnetic layer and aligning a magnetization of the free magnetic layer in the track width direction.

11. The magnetic sensing element according to claim 1, further comprising exchange bias layers comprising an antiferromagnetic material and overlapping with the free magnetic layer, the exchange bias layers aligning a magnetization of the free magnetic layer in the track width direction.

12. The magnetic sensing element according to claim 1, further comprising a spacing layer in contact with one face, opposite to the nonmagnetic layer, of the free magnetic layer and a ferromagnetic in-stack bias layer in contact with the spacing layer, the in-stack bias layer aligning a magnetization of the free magnetic layer in the track width direction.

13. The magnetic sensing element according to claim 1, further comprising specular layers on the side faces of the composite film in the track width direction.

14. The magnetic sensing element according to claim 2, further comprising upper insulating layers for electrically insulating the upper electrode layer from the side faces of the composite film.

15. The magnetic sensing element according to claim 14, wherein the upper insulating layers have flat surfaces.

16. The magnetic sensing element according to claim 2, further comprising lower insulating layers on the side faces of the composite film, for electrically insulating the lower electrode layer from the side faces of the composite film.

17. The magnetic sensing element according to claim 2, wherein the antiferromagnetic layer, the pinned magnetic layer, the nonmagnetic layer, and the free magnetic layer are disposed in that order from the bottom.

18. The magnetic sensing element according to claim 17, wherein the bent position lies at the corresponding side face in the track width direction of the pinned magnetic layer.

19. The magnetic sensing element according to claim 17, wherein the bent position lies at the corresponding side face in the track width direction of the antiferromagnetic layer.

20. The magnetic sensing element according to claim 2, wherein the free magnetic layer, the nonmagnetic layer, the pinned magnetic layer, and the antiferromagnetic layer are disposed in that order from the bottom.

21. The magnetic sensing element according to claim 2, further comprising hard bias layers comprising a hard magnetic material, the hard bias layers opposing side faces in the track width direction of at least the free magnetic layer and aligning a magnetization of the free magnetic layer in the track width direction.

22. The magnetic sensing element according to claim 2, further comprising exchange bias layers comprising an antiferromagnetic material and overlapping with the free magnetic layer, the exchange bias layers aligning a magnetization of the free magnetic layer in the track width direction.

23. The magnetic sensing element according to claim 2, further comprising a spacing layer in contact with one face, opposite to the nonmagnetic layer, of the free magnetic layer and a ferromagnetic in-stack bias layer in contact with the spacing layer, the in-stack bias layer aligning a magnetization of the free magnetic layer in the track width direction.

24. The magnetic sensing element according to claim 2, further comprising specular layers on the side faces of the composite film in the track width direction.

* * * * *